(12) United States Patent
Annunziata et al.

(10) Patent No.: US 9,786,837 B2
(45) Date of Patent: Oct. 10, 2017

(54) MULTIBIT SELF-REFERENCE THERMALLY ASSISTED MRAM

(71) Applicants: International Business Machines Corporation, Armonk, NY (US); Crocus Technology SA, Grenoble (FR)

(72) Inventors: Anthony J. Annunziata, Stamford, CT (US); Lucian Prejbeanu, Grenoble (FR); Philip L. Trouilloud, Norwood, NY (US); Daniel C. Worledge, Cortlandt Manor, NY (US)

(73) Assignees: INTERNATIONAL BUSINESS MACHINES CORPORATION, Armonk, NY (US); CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/887,856

(22) Filed: Oct. 20, 2015

(65) Prior Publication Data

US 2016/0043309 A1 Feb. 11, 2016

Related U.S. Application Data

(62) Division of application No. 14/583,983, filed on Dec. 29, 2014, now Pat. No. 9,406,870.

(60) Provisional application No. 61/977,236, filed on Apr. 9, 2014, provisional application No. 61/977,243, filed on Apr. 9, 2014.

(51) Int. Cl.
| | |
|---|---|
| *H01L 43/02* | (2006.01) |
| *G11C 11/16* | (2006.01) |
| *H01L 43/08* | (2006.01) |
| *H01L 43/12* | (2006.01) |
| *G11C 11/56* | (2006.01) |

(52) U.S. Cl.
CPC ............ *H01L 43/02* (2013.01); *G11C 11/161* (2013.01); *G11C 11/1673* (2013.01); *G11C 11/1675* (2013.01); *G11C 11/5607* (2013.01); *H01L 43/08* (2013.01); *H01L 43/12* (2013.01)

(58) Field of Classification Search
CPC ......... H01L 43/02; H01L 43/12; H01L 43/08; G11C 11/161; G11C 11/1673; G11C 11/1675
USPC .................................. 257/421, 211
See application file for complete search history.

(56) References Cited

U.S. PATENT DOCUMENTS

| 8,809,827 B1 | 8/2014 | Annunziata | |
|---|---|---|---|
| 2011/0227018 A1* | 9/2011 | Kuribayashi | B82Y 10/00 257/2 |

(Continued)

OTHER PUBLICATIONS

Anthony J. Annunziata, et al., "Multibit Self-Reference Thermally Assisted MRAM," U.S. Appl. No. 14/887,782, filed Oct. 20, 2015.

(Continued)

*Primary Examiner* — Bo Fan
(74) *Attorney, Agent, or Firm* — Cantor Colburn LLP; Vazken Alexanian

(57) ABSTRACT

A mechanism is provided for a thermally assisted magnetoresistive random access memory device (TAS-MRAM). A storage layer has an anisotropic axis, in which the storage layer is configured to store a state in off axis positions and on axis positions. The off axis positions are not aligned with the anisotropic axis. A tunnel barrier is disposed on top of the storage layer. A ferromagnetic sense layer is disposed on top of the tunnel barrier.

16 Claims, 14 Drawing Sheets

(56) References Cited

U.S. PATENT DOCUMENTS

| | | | |
|---|---|---|---|
| 2012/0300539 A1* | 11/2012 | Lombard | G11C 11/161 365/158 |
| 2013/0082339 A1* | 4/2013 | Aggarwal | H01L 43/12 257/421 |
| 2014/0273284 A1 | 9/2014 | Annunziata | |
| 2015/0294708 A1 | 10/2015 | Annunziata et al. | |
| 2015/0295165 A1 | 10/2015 | Annunziata et al. | |

OTHER PUBLICATIONS

List of IBM Patents or Patent Applications Treated as Related, YOR920130555US4, Date Filed: Oct. 20, 2015, pp. 1-2.

* cited by examiner

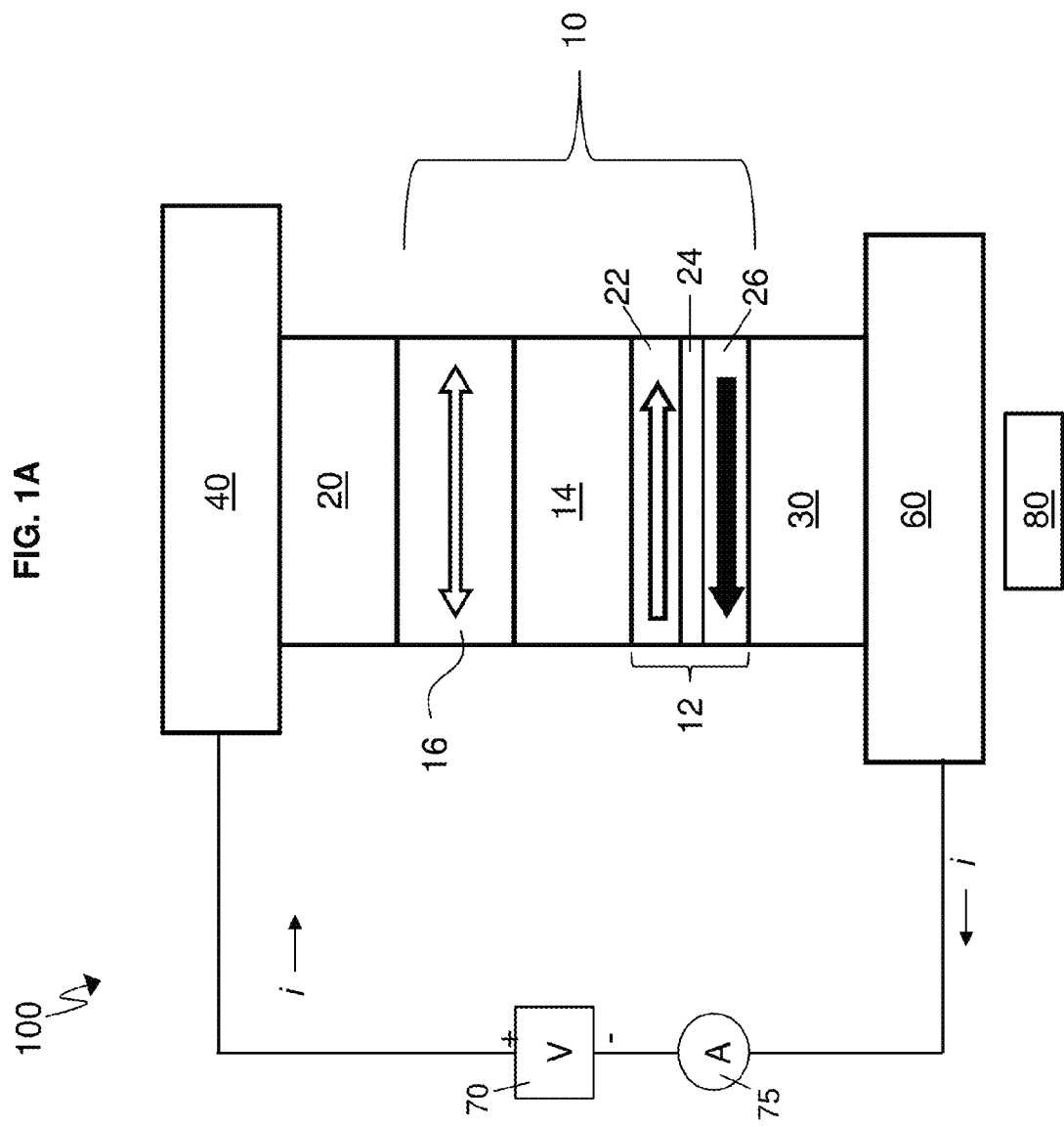

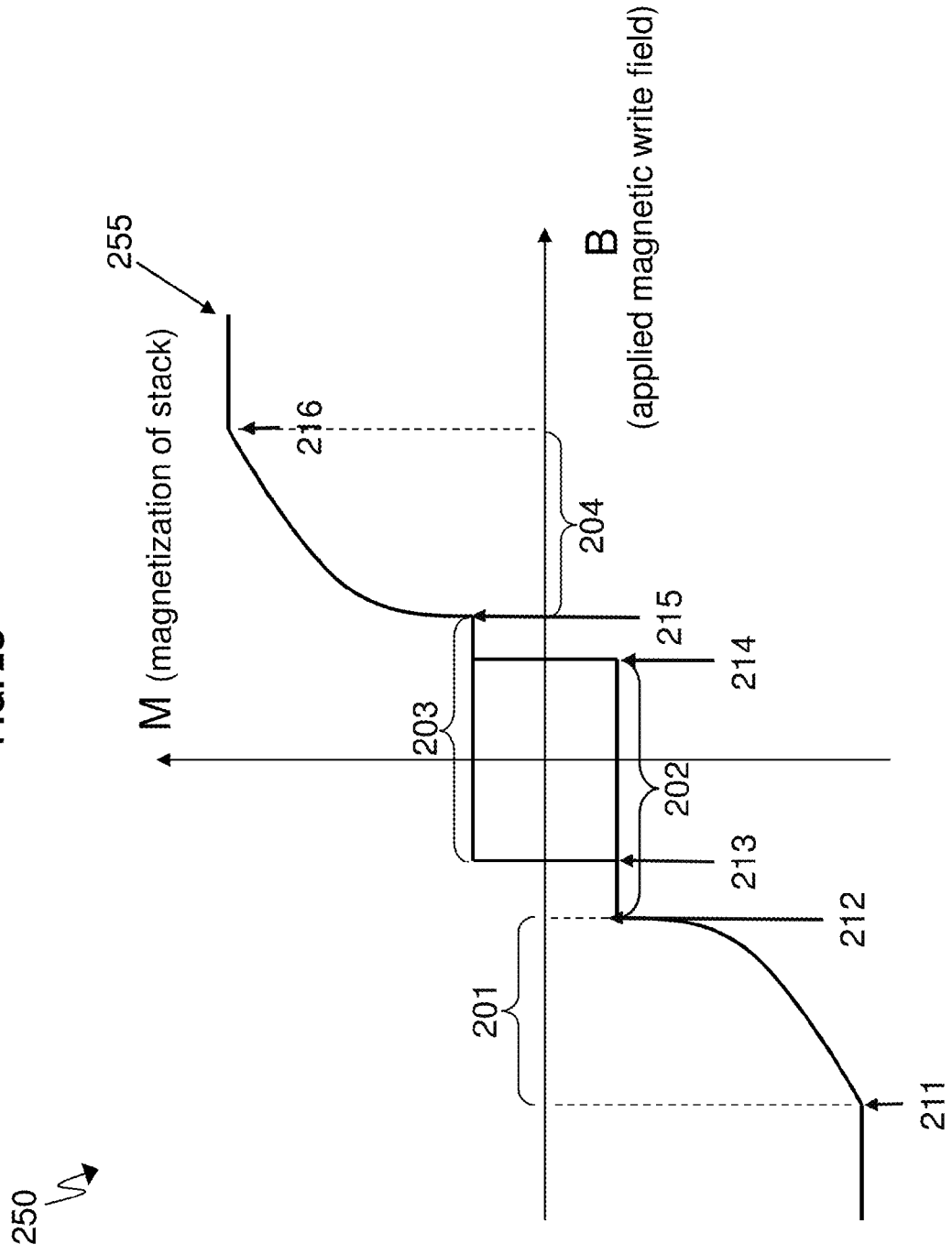

MULTIBIT SELF-REFERENCE THERMALLY ASSISTED MRAM

This application is a divisional of U.S. patent application Ser. No. 14/583,983, filed Dec. 29, 2014, which claims priority to Provisional Application No. 61/977,236, filed on Apr. 9, 2014, and claims priority to Provisional Application No. 61/977,243, filed on Apr. 9, 2014, all of which are herein incorporated by reference in their entirety.

BACKGROUND

The present invention relates generally to magnetic memory devices, and more specifically, to thermally assisted MRAM devices that provide multibit storage in the MRAM device.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction and is the simplest structure for a MRAM bit. A memory device is built from a grid of such "cells." In some configurations of MRAM, such as the type further discussed herein, both the reference and free layers of the magnetic tunnel junctions can be switched using an external magnetic field. In some configurations of MRAM, such as the type further discussed herein, called thermally-assisted MRAM, heat is applied to the tunnel junction when writing to a bit. In particular, the free magnet tends to be stable at a normal operating temperature, and it is more difficult to change magnetic polarity of the free magnet at a normal operating temperature. Providing heat to the free magnet may facilitate changing of a polarity of the free magnet to program a magnetic state of the free magnet. In particular, in the devices described herein, in order to thermally write the bit, a magnetic field is applied simultaneously with a heating voltage that allows for overcoming the blocking temperature of the antiferromagnetic layer, which exchange biases (providing a pinning direction) with the synthetic antiferromagnet (SAF) storage layer, allowing the storage layer magnetization to be reoriented and re-pinned by exchange bias into the new position after the device cools.

SUMMARY

According to one embodiment, a thermally assisted magnetoresistive random access memory device (TAS-MRAM) is provided. A storage layer has an anisotropic axis. The storage layer is configured to store a state in off axis positions and on axis positions. The off axis positions are not aligned with the anisotropic axis. A tunnel barrier is disposed on top of the storage layer. A ferromagnetic sense layer is disposed on top of the tunnel barrier.

According to one embodiment, a method is provided for writing data to a state in a thermally assisted magnetoresistive random access memory device (TAS-MRAM). The method includes setting a magnetic orientation of a storage layer to a position for storing the state. The storage layer has an anisotropic axis, and the position of the magnetic orientation includes off axis positions and on axis positions relative to the anisotropic axis. The method includes reading the state in the storage layer to obtain a first resistance value and a second resistance value, and comparing the first resistance value and the second resistance value to predetermined resistance values. When the first resistance value and the second resistance value are different from the predetermined resistance values, the magnetic orientation of the storage layer is reset to the position for storing the state. When the first resistance value and the second resistance value match the predetermined resistance values, it is recognized that the predetermined resistance values have been met to store the state.

According to one embodiment, a method is provided for forming a thermally assisted magnetoresistive random access memory device (TAS-MRAM). The method includes providing a storage layer having an anisotropic axis, wherein the storage layer is configured to store a state in off axis positions and on axis positions. The off axis positions are not aligned with the anisotropic axis. The method includes disposing a tunnel barrier on top of the storage layer and disposing a ferromagnetic sense layer on top of the tunnel barrier.

According to one embodiment, a thermally assisted magnetoresistive random access memory device (TAS-MRAM) is provided. The device includes a multilayer spacer structure having multiple layers of metals structured to inhibit thermal conductivity and structured to electrically conduct electrical current, an antiferromagnetic pinning layer disposed on the multilayer spacer structure, and a magnetic tunnel junction disposed on the antiferromagnetic pinning layer. The magnetic tunnel junction, the antiferromagnetic pinning layer, and the multilayer spacer structure are patterned to a same pattern.

According to one embodiment, a thermally assisted magnetoresistive random access memory device (TAS-MRAM) is provided. The device includes a multilayer spacer structure having multiple layers of metals structured to inhibit thermal conductivity and structured to electrically conduct electrical current, an antiferromagnetic pinning layer disposed on the multilayer spacer structure, and a magnetic tunnel junction disposed on the antiferromagnetic pinning layer. The magnetic tunnel junction includes a storage layer, a non-magnetic tunnel barrier disposed on the storage layer, and a ferromagnetic sense layer disposed on the non-magnetic tunnel barrier. The ferromagnetic sense layer includes multiple layers of materials to inhibit thermal conductivity while electrically conducting the electrical current.

According to one embodiment, a method of forming a thermally assisted magnetoresistive random access memory device (TAS-MRAM) is provided. The method includes forming a multilayer spacer structure having multiple layers of metals structured to inhibit thermal conductivity and structured to electrically conduct electrical current, disposing an antiferromagnetic pinning layer on the multilayer spacer structure, and disposing a magnetic tunnel junction on the antiferromagnetic pinning layer. The magnetic tunnel junction includes a storage layer, a non-magnetic tunnel barrier disposed on the storage layer, and a ferromagnetic sense layer disposed on the non-magnetic tunnel barrier. The ferromagnetic sense layer includes multiple layers of materials to inhibit thermal conductivity while electrically conducting the electrical current.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1A illustrates a cross-sectional view of a multibit thermally-assisted magnetoresistive random access memory (TAS-MRAM) device according to an embodiment.

FIG. 2C illustrates a typical hysteresis loop corresponding to a SAF storage layer when the external field is applied along the anisotropy axis.

DETAILED DESCRIPTION

Figure 1B:
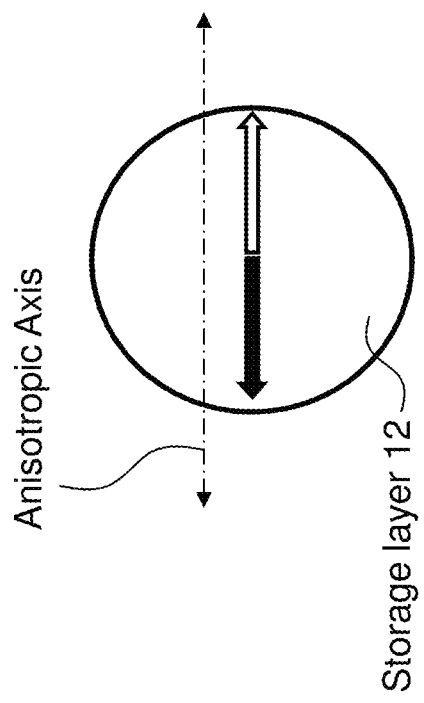
FIG. 1B illustrates a schematic of the anisotropic axis and the possible orientations of the magnetizations of the layers in the synthetic antiferromagnet (SAF) storage layer according to an embodiment.

Thermally-assisted magnetoresistive random access memory (TAS-MRAM) requires heating of the magnetic tunnel junction stack to a write temperature ($T_{write}$) higher than the operating temperature ($T_{op}$) in order to write the device. This is typically done by Joule heating from a bias current that is applied during the write process. The amount of power required to heat the device to $T_{write}$ is strongly dependent on the thermal conductivity between the device and the surrounding structures and substrate, which are at $T_{op}<T_{write}$.

FIG. 1 illustrates a structure for a multibit self reference thermally-assisted magnetoresistive random access memory (TAS-MRAM) device 100 according to an embodiment.

The structure of the MRAM device 100 includes a magnetic tunnel junction (MTJ) 10. The magnetic tunnel junction 10 may include a storage layer 12 with a non-magnetic tunnel barrier 14 disposed on the storage layer 12. The non-magnetic tunnel barrier 14 may be a semiconductor or insulator with a high resistance. The magnetic tunnel junction 10 also includes a sense ferromagnetic layer 16 disposed on top of the non-magnetic tunnel barrier 14. The storage layer 12 is made up of a bottom ferromagnetic layer 26 shown with a left magnetic orientation (e.g., left pointing solid arrow), a non-magnetic spacer 24 disposed on top of the bottom ferromagnetic layer 26, and a top ferromagnetic layer 22 shown with a right magnetic orientation (e.g., right pointing open arrow). The non-magnetic spacer 24 couples the magnetic orientation of the top and bottom ferromagnetic layers 22 and 26 in opposite magnetic directions in the storage layer 12. The magnetic orientation of the storage layer 12 is based on the direction of the top ferromagnetic layer 22 (i.e., the open arrow in the storage layer 12). Note that in one case the storage layer 12 may only include the top ferromagnetic layer 22 with the open arrow in the storage layer 12.

The magnetic orientation of the ferromagnetic sense layer 16 may be flipped to have a left or right magnetic orientation and is shown with a double open arrow.

The tunnel magnetoresistance (TMR) of the magnetic tunnel junction 10 is based on the magnetic orientation of the ferromagnetic sense layer 16 relative to the magnetic orientation of the top ferromagnetic layer 22 of the storage layer 12. When the magnetic orientation of the ferromagnetic sense layer 16 is parallel to the magnetic orientation of the top ferromagnetic layer 22 (i.e., both arrows point in the same direction), the resistance of the magnetic tunnel junction 10 (as well as the TAS-MRAM device 100) is low (i.e., logical 1). When the magnetic orientation of the ferromagnetic sense layer 16 is antiparallel to the magnetic orientation of the top ferromagnetic layer 22 (i.e., both arrows point in opposite directions), the resistance of the magnetic tunnel junction 10 (as well as the TAS-MRAM device 100) is high (e.g., logical 0).

TMR is a magnetoresistive effect that occurs in the magnetic tunnel junction (MTJ) 10, which is a component consisting of two ferromagnets (i.e., the ferromagnetic sense layer 16 and the storage layer 12) separated by a thin insulator (i.e., tunnel barrier 14). If the insulating layer is thin enough (typically a few nanometers), electrons can tunnel from one ferromagnet into the other.

The magnetic tunnel junction 10 (particularly the storage layer 12) is disposed on top of an antiferromagnetic layer 30. The antiferromagnetic layer 30 is disposed on top of a contact structure 60 (e.g., electrode) that electrically connects the magnetic tunnel junction 10 (MRAM device 100) to a voltage source 70 (and/or current source). The antiferromagnetic layer 30 can also be located below the SAF storage layer.

The antiferromagnetic layer 30 is an antiferromagnet and may include materials such as, e.g., IrMn, FeMn, PtMn, etc. The antiferromagnetic layer 30 is composed of two magnetic sublattices. The two magnetic sublattices have opposite magnetic orientations (also referred to as a magnetic moments), such that the net magnetic moment of the antiferromagnetic layer 30 is zero. Since antiferromagnets have a small or no net magnetization, their spin orientation is only weakly influenced by an externally applied magnetic field.

A contact structure 20 (e.g., electrode) is disposed on top of the magnetic tunnel junction 10 (particularly on top of the ferromagnetic sense layer 16) connecting the magnetic tunnel junction 10 (MRAM device 100) to a wire 40 that connects to the voltage source 70. Voltage and/or current generated by the voltage source 70 are required to heat the TAS-MRAM device 100 to a write temperature ($T_{write}$).

Now, the write operation for the MRAM device 100 is discussed. The voltage source 70 produces a voltage, and the write bias current (i) flows into the wire 40, into the contact structure 20, through the MTJ 10, out through the antiferromagnetic layer 30, and out through the contact structure 60 (back to the voltage source 70). The MTJ 10 (particularly the tunnel barrier 14) has a high resistance compared to the other layers of the MRAM device 100, which causes Joule heating at the MTJ 10. When the write temperature $T_{write}$ is reached, the heating has placed the storage layer 12 in condition to have its magnetic orientation flipped and/or changed (e.g., to various positions including off axis positions as discussed herein) by a magnetic write field applied by the magnetic write field generating device 80. In other words, heating the MTJ 10 to the write temperature $T_{write}$ destabilizes the magnetic orientation of the storage layer 12 so that the applied magnetic field can flip and/or rotate the magnetic orientation as desired. The magnetic write field generating device 80 may be a combination of an (insulated) metal wire connected to a voltage source (not shown) to generate the magnetic field and/or may be CMOS (complementary metal-oxide-semiconductor) circuitry as understood by one skilled in the art.

FIG. 1B shows a schematic of the storage layer 12 (from the top down). In FIG. 1B, the anisotropic axis is represented with a horizontal dashed line. The horizontal dashed line illustrates that the anisotropic axis of the storage layer 12 is horizontal. The anisotropic axis is the axis to which magnetic orientation (of the ferromagnetic layers of) the storage layer 12 wants to align with. In FIG. 1A, the solid arrow representing the magnetic orientation of the bottom ferromagnetic layer 26 is pointing left in accord/parallel with the anisotropic axis (i.e., on axis), while the open arrow representing the magnetic orientation of the top ferromagnetic layer 22 is pointing right in accord/parallel with the anisotropic axis (i.e., on axis).

Note that magnetic anisotropy is the directional dependence of a material's magnetic properties. In the absence of an applied magnetic field, a magnetically isotropic material has no preferential direction for its magnetic moment (i.e., magnetic orientation), while a magnetically anisotropic material will align its moment with one of the easy axes. An easy axis is an energetically favorable direction of spontaneous magnetization. The two opposite directions (e.g., left and right magnetic orientations for a horizontal anisotropic axis) along an easy axis are usually equivalent, and the actual direction of magnetization can be along either of them.

Figure 2A:
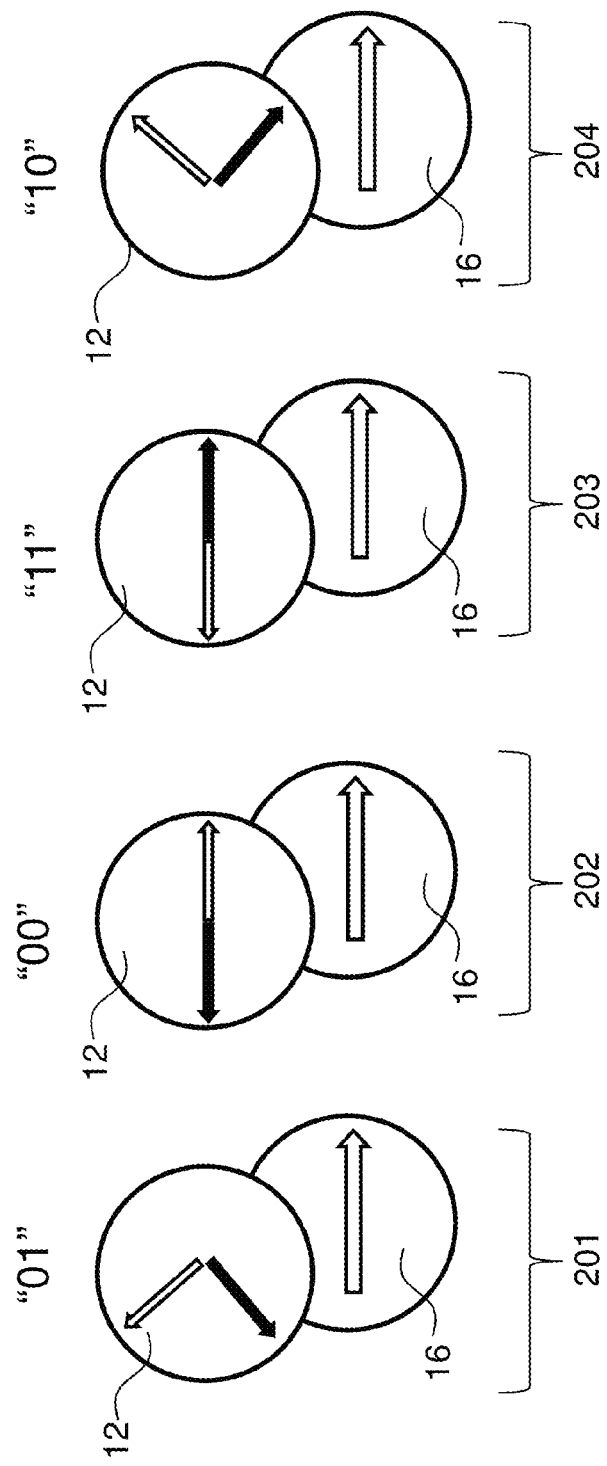
FIG. 2A illustrates states (including off axis magnetic orientations) for storing bits in the storage layer according to an embodiment.
Figure 2B:
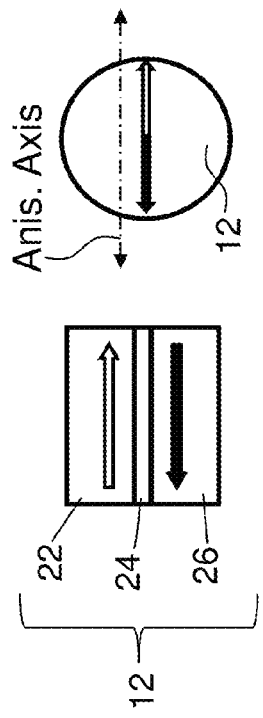
FIG. 2B illustrates that the storage layer is composed of a synthetic antiferromagnet (SAF) layer with antiparallel coupling, and that the anisotropic axis of the storage layer is horizontal, i.e., parallel to the anisotropy axis of the sense layer, according to an embodiment.

According to embodiments, examples of off axis storage of bits (as states) in the storage layer 12 are provided below. Although the magnetic orientation (solid arrow) of the bottom ferromagnetic layer 26 is discussed (for completeness), the TMR (corresponding to the desired state) is based on the magnetic interaction of the magnetic orientation (open arrow) of the top ferromagnetic layer 22 and the magnetic orientation of the ferromagnetic sense layer 16. FIGS. 2A, 2B, and 2C (generally referred to as FIG. 2) illustrate storing multiple bits in the MRAM device 100 according to an embodiment. FIG. 2A depicts 4 states for storing bits in the storage layer 12. The magnetic orientations of the open arrow and the solid arrow can be stored in various off axis positions, and are not limited to the anisotropic axis of the storage layer 12 (i.e., not limited to being parallel to the anisotropic axis of the top and bottom ferromagnets 22 and 26). In this case, FIG. 2B shows that the anisotropic axis of the storage layer 12 is horizontal.

The states shown for the storage layer 12 in FIG. 2A are state 201, state 202, state 203, and state 204. For explanation purposes it is assumed (in FIGS. 2, 3, and 4) that the anisotropic axis for the ferromagnetic sense layer 16 is horizontal and the ferromagnetic sense layer 16 has a magnetic orientation (initially) pointing right for each of the states 201 through 204. Note that the magnetic orientation of the ferromagnetic sense layer 16 may be flipped to the left during the writing and/or reading process (as desired).

For state 201 stored in the storage layer 12, the open arrow magnetic orientation (of the top ferromagnetic layer 22) is off axis (e.g., pointing at approximately 11 o'clock), and the solid arrow magnetic orientation (of the bottom ferromagnetic layer 26) is off axis (e.g., pointing at approximately 7 o'clock). FIG. 2C illustrates a graph 250 of the applied magnetic write field (B) (e.g., via the magnetic write field generating device 80) on the x-axis versus the magnetization of the MTJ 10 stack is on the y-axis.

In FIG. 2C, state 201 corresponds to the portion of the curve 255 identified at which the applied magnetic (B) field is the most negative on the x-axis, while the magnetization of the stack (MTJ 10) is most negative on the y-axis. The magnetic moment of the ferromagnetic sense layer 16 is pointing right as noted above. State 201 in the curve 255 illustrates the applied magnetic write field as applied by the magnetic write field generating device 80, which is utilized to store the state for the off axis magnetic orientations shown by the open arrow and solid arrow in the storage layer 12.

For state 202 stored in the storage layer 12, the open arrow magnetic orientation (of the top ferromagnetic layer 22) is on axis (e.g., pointing at approximately 3 o'clock), and the solid arrow magnetic orientation (of the bottom ferromagnetic layer 26) is on axis (e.g., pointing at approximately 9 o'clock). State 202 corresponds to the portion of the curve 255 identified at state 202, which includes negative and positive applied magnetic (B) fields on the x-axis, while magnetization of the stack (MTJ 10) is negative. The magnetic moment of the ferromagnetic sense layer 16 is pointing right as noted above. State 202 in the curve 255 illustrates the applied magnetic write field as applied by the magnetic write field generating device 80 that is utilized to store the state 202 for the on axis magnetic orientations shown by the open arrow and solid arrow in the storage layer 12.

For state 203 stored in the storage layer 12, the open arrow magnetic orientation (of the top ferromagnetic layer 22) is on axis (e.g., pointing at approximately 9 o'clock), and the solid arrow magnetic orientation (of the bottom ferromagnetic layer 26) is on axis (e.g., pointing at approximately 3 o'clock). State 203 corresponds to the portion of the curve 255 identified at state 203, which also includes negative and positive applied magnetic (B) fields on the x-axis, while magnetization of the stack (MTJ 10) is positive. The magnetic moment of the ferromagnetic sense layer 16 is pointing right as noted above. State 203 in the curve 255 illustrates the applied magnetic write field as applied by the magnetic write field generating device 80, which is utilized to store the state 203 for the on axis magnetic orientations shown by the open arrow and solid arrow in the storage layer 12.

For state 204 stored in the storage layer 12, the open arrow magnetic orientation (of the top ferromagnetic layer 22) is off axis (e.g., pointing at approximately 2 o'clock), and the solid arrow magnetic orientation (of the bottom ferromagnetic layer 26) is on axis (e.g., pointing at approximately 4 o'clock). State 204 corresponds to the portion of the curve 255 identified at state 204, which includes positive applied magnetic (B) fields on the x-axis, while magnetization of the stack (MTJ 10) is positive. The magnetic moment of the ferromagnetic sense layer 16 is pointing right as noted above. State 204 in the curve 255 illustrates the applied magnetic write field as applied by the magnetic write field generating device 80, which is utilized to store the state 204 for the on axis magnetic orientations shown by the open arrow and solid arrow in the storage layer 12.

When measuring the magnetic tunnel junction 10 (by measuring the resistance of the MRAM device 100 via voltage source 70 and ammeter 75), each of the 4 states has two measured resistance values: a first resistance value (kΩ) when the ferromagnetic sense layer 16 is pointing to the right and a second resistance value (kΩ) when the ferromagnetic sense layer 16 (or vice versa). Accordingly, state 201 (while the magnetic orientations of the top and bottom ferromagnetic 22 and 26 do not change) has two measured resistance values one higher than the other, state 202 (while the magnetic orientations of the top and bottom ferromagnetic 22 and 26 do not change) has two measured resistance values one higher than the other resistance value, similarly state 203 (while the magnetic orientations of the top and bottom ferromagnetic 22 and 26 do not change) has two measured resistance values one higher than the other, and likewise state 204 (while the magnetic orientations of the top and bottom ferromagnetic 22 and 26 do not change) has two measured resistance values one higher than the other.

Typically, the coercive field $H_c$ (213, 214) is approximately (~) 100 Oe, the spin-flop field $H_{sf}$ (212, 215) is approximately (~) 200 Oe, and the saturation field $H_{sat}$ (211, 216) is approximately (~) 500 Oe. $H_c$ is mostly dependent on the difference of magnetizations of the 2 layers of the SAF, and $H_{sf}$ and $H_{sat}$ depend on the Ru RKKY antiparallel coupling between the 2 layers of the SAF.

In order to adjust $H_c$, $H_{sf}$, and $H_{sat}$, the thickness and the saturation magnetization of the top and bottom ferromagnetic layers 22 and 26 must be adjusted. The saturation magnetization can be tuned by changing the materials type; materials such as CoFe, CoFeB, and NiFe are useful. The typical thicknesses can range from 10 to 50 Angstroms (Å) for each ferromagnetic layer 22 and 26.

Figure 3A:
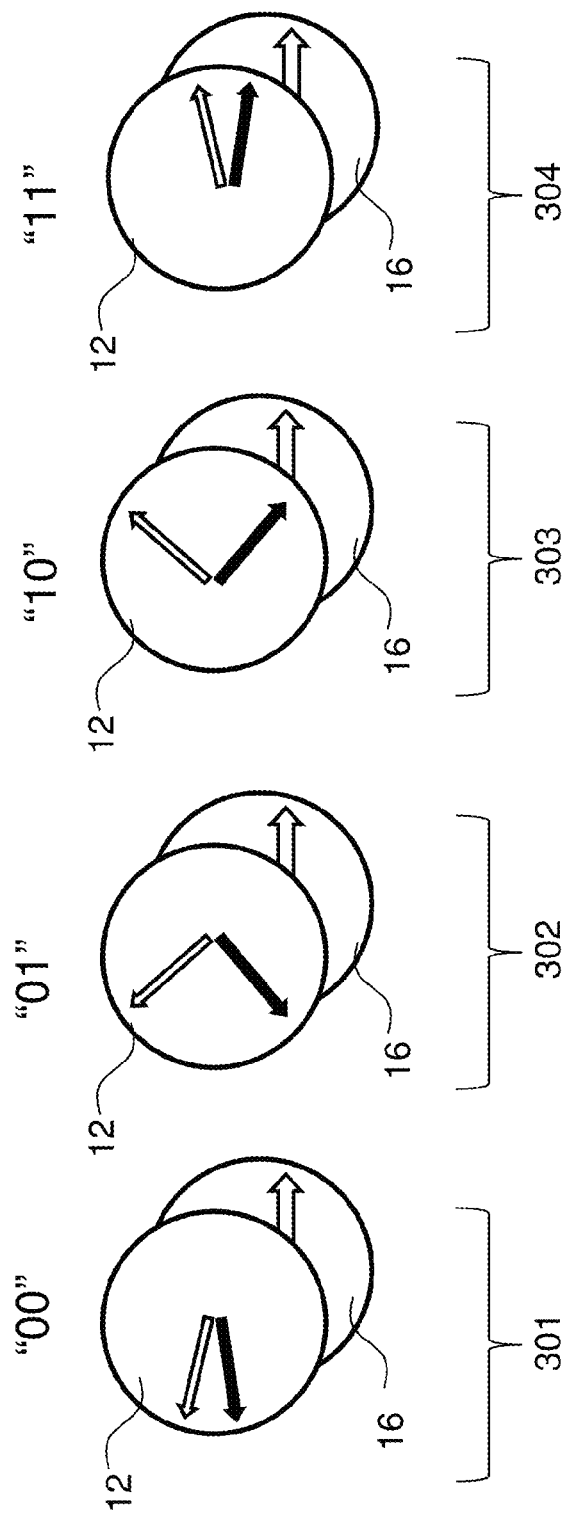
FIG. 3A illustrates states (including off axis magnetic orientations) for storing bits in the storage layer according to an embodiment, where the anisotropy axis of the storage layer is perpendicular to the anisotropy axis of the sense layer, and where for writing, two different polarities (positive and negative directions) of the external applied magnetic field are employed.
Figure 3B:
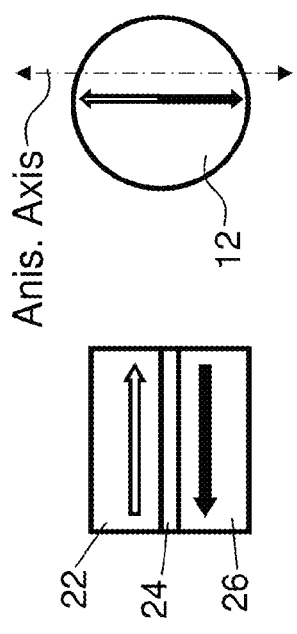
FIG. 3B illustrates that the anisotropic axis of the storage layer is vertical according to an embodiment, where the anisotropy axis of the storage layer is in plane, perpendicular to the anisotropy axis of the sense layer.
Figure 3C:
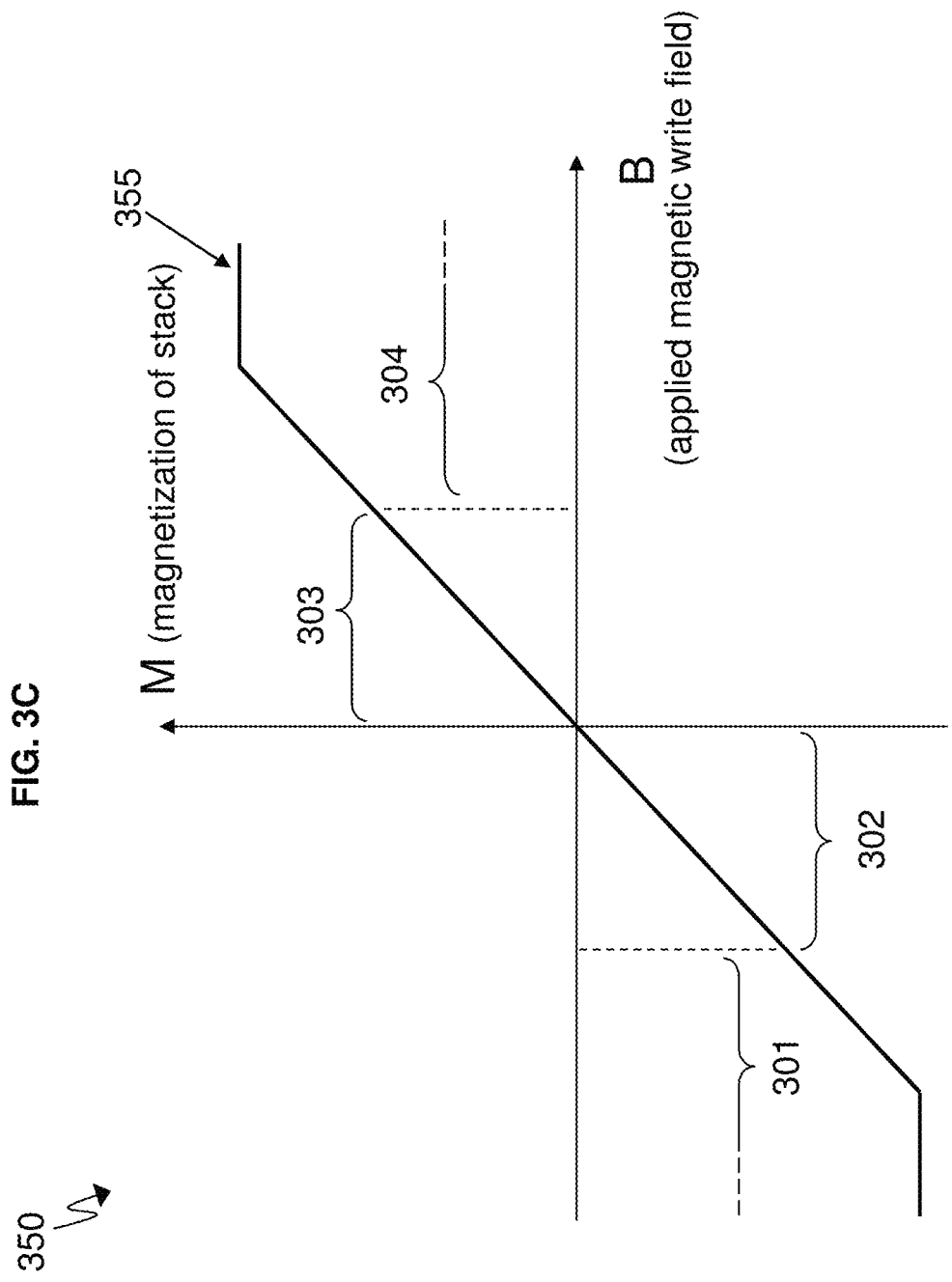
FIG. 3C illustrates a typical hysteresis loop corresponding to a SAF storage layer when the external field is applied perpendicular to the anisotropy axis of the storage layer according to an embodiment.

According to an embodiment, examples of off axis storage of bits (as states) in the storage layer 12 are provided below. FIGS. 3A, 3B, and 3C (generally referred to as FIG. 3) illustrate storing multiple bits in the MRAM device 100 according to an embodiment. FIG. 3A depicts 4 states for storing bits in the storage layer 12. The magnetic orientations of the open arrow and the solid arrow can be stored in various off axis positions, and are not limited to the anisotropic axis of the storage layer 12 (i.e., not limited to being parallel to the anisotropic axis of the top and bottom ferromagnets 22 and 26). In this case, FIG. 3B shows that the anisotropic axis of the storage layer 12 is vertical (or not horizontal).

The states shown for the storage layer 12 in FIG. 3A are state 301, state 302, state 303, and state 304. For explanation purposes, it is again assumed that the anisotropic axis for the ferromagnetic sense layer 16 is horizontal, and the ferromagnetic sense layer 16 (initially) has a magnetic orientation pointing right for each of the states 301 through 304. Note that the magnetic orientation of the ferromagnetic sense layer 16 may be flipped to the left during the writing and/or reading process (as desired).

For state 301 stored in the storage layer 12, the open arrow magnetic orientation (of the top ferromagnetic layer 22) is off axis (e.g., pointing at approximately 9:45), and the solid arrow magnetic orientation (of the bottom ferromagnetic layer 26) is off axis (e.g., pointing at approximately 8:50). FIG. 3C illustrates a graph 350 of the applied magnetic write field (B) (e.g., via the magnetic write field generating device 80) on the x-axis versus the magnetization (M) of the MTJ 10 stack on the y-axis.

State 301 corresponds to the portion of the curve 355 identified as state 301 at which the applied magnetic (B) field is the most negative on the x-axis, while magnetization (M) of the stack (MTJ 10) is most negative on the y-axis. The magnetic moment/orientation of the ferromagnetic sense layer 16 is pointing right as noted above. State 301 in the curve 355 illustrates the applied magnetic write field as applied by the magnetic write field generating device 80, which is utilized to store the off axis magnetic orientations shown by the open arrow and solid arrow in the storage layer 12.

For state 302 stored in the storage layer 12, the open arrow magnetic orientation (of the top ferromagnetic layer 22) is off axis (e.g., pointing at approximately 11 o'clock), and the solid arrow magnetic orientation (of the bottom ferromagnetic layer 26) is off axis (e.g., pointing at approximately 7 o'clock). State 302 corresponds to the portion of the curve 355 identified at state 302, which includes a negative applied magnetic (B) fields on the x-axis, while magnetization (M) of the stack (MTJ 10) is negative. The magnetic moment of the ferromagnetic sense layer 16 is pointing right as noted above. State 302 in the curve 355 illustrates the applied magnetic write field as applied by the magnetic write field generating device 80 that is utilized to store the magnetic orientations shown by the open arrow and solid arrow in the storage layer 12.

For state 303 stored in the storage layer 12, the open arrow magnetic orientation (of the top ferromagnetic layer 22) is off axis (e.g., pointing at approximately 2 o'clock), and the solid arrow magnetic orientation (of the bottom ferromagnetic layer 26) is on axis (e.g., pointing at approximately 5 o'clock). State 303 corresponds to the portion of the curve 355 identified at state 303, which includes positive applied magnetic (B) fields on the x-axis, while magnetization (M) of the stack (MTJ 10) is positive. The magnetic moment of the ferromagnetic sense layer 16 is pointing right as noted above. State 303 in the curve 355 illustrates the applied magnetic write field as applied by the magnetic write field generating device 80, which is utilized to store the on axis magnetic orientations shown by the open arrow and solid arrow in the storage layer 12.

For state 304 stored in the storage layer 12, the open arrow magnetic orientation (of the top ferromagnetic layer 22) is off axis (e.g., pointing at approximately 2:45), and the solid arrow magnetic orientation (of the bottom ferromagnetic layer 26) is off axis (e.g., pointing at approximately 3:15). State 304 corresponds to the portion of the curve 355 identified at state 304, which includes positive applied magnetic (B) fields on the x-axis, while magnetization (M) of the stack (MTJ 10) is positive. The magnetic moment of the ferromagnetic sense layer 16 is pointing right as noted above. State 304 in the curve 355 illustrates the applied magnetic write field as applied by the magnetic write field generating device 80, which is utilized to store the on axis magnetic orientations shown by the open arrow and solid arrow in the storage layer 12.

When measuring the magnetic tunnel junction 10 (by measuring the resistance of the MRAM device 100 via voltage source 70 and ammeter 75), each of the 4 states has two measured resistance values: a first resistance value (kΩ) when the ferromagnetic sense layer 16 is pointing to the right and a second resistance value (kΩ) when the ferromagnetic sense layer 16. Accordingly, state 301 (while the magnetic orientations of the top and bottom ferromagnetic 22 and 26 do not change) has two measured resistance values one higher than the other, state 302 (while the magnetic orientations of the top and bottom ferromagnetic 22 and 26 do not change) has two measured resistance values one higher than the other resistance value, similarly state 303 (while the magnetic orientations of the top and bottom ferromagnetic 22 and 26 do not change) has two measured resistance values one higher than the other, and likewise state 304 (while the magnetic orientations of the top and bottom ferromagnetic 22 and 26 do not change) has two measured resistance values one higher than the other.

In this embodiment, states are obtained by continuously varying the applied magnetic field form negative to positive values (therefore, using both polarities of applied field). Typical field values for (301-304) are: 301 is approximately (~) −100 Oe, 302 is approximately (~) −50 Oe, 303 is approximately (~) 50 Oe, 304 is approximately (~) 100 Oe.

In order to adjust $H_c$, $H_{sf}$, and $H_{sat}$, the thickness and the saturation magnetization of the top and bottom ferromagnetic layers 22 and 26 must be adjusted. The saturation magnetization can be tuned by changing the materials type; materials such as CoFe, CoFeB, and NiFe are useful. The typical thicknesses can range from 10-50 Å for each ferromagnetic layer 22 and 26.

Figure 4A:
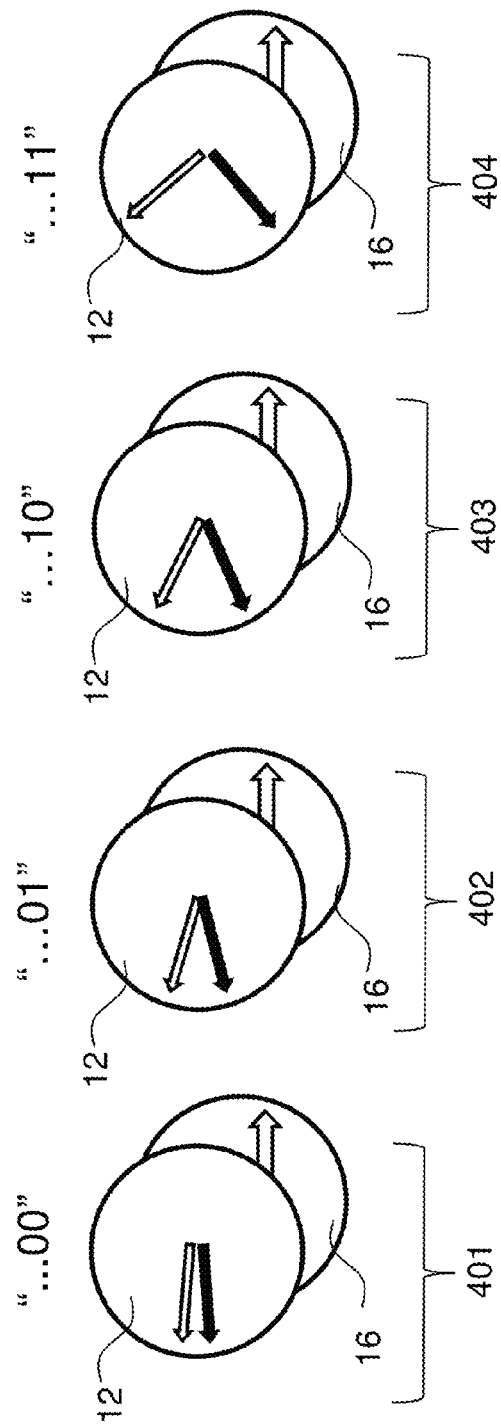
FIG. 4A illustrates states (including off axis magnetic orientations) for storing bits in the storage layer according to an embodiment, wherein the anisotropy axis of the storage layer is perpendicular to the anisotropy axis of the sense layer; for the writing, only one polarity (positive or negative directions, but not both) of the external applied magnetic field is employed.
Figure 4B:
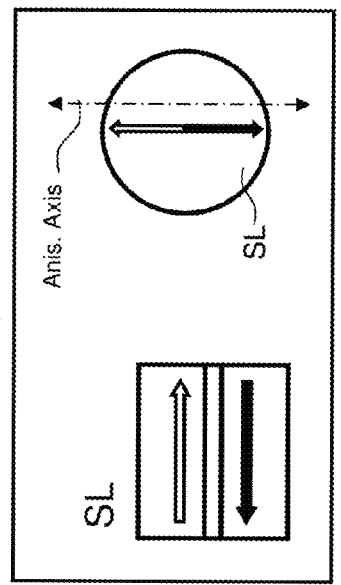
FIG. 4B illustrates that the anisotropic axis of the storage layer is vertical according to an embodiment.
Figure 4C:
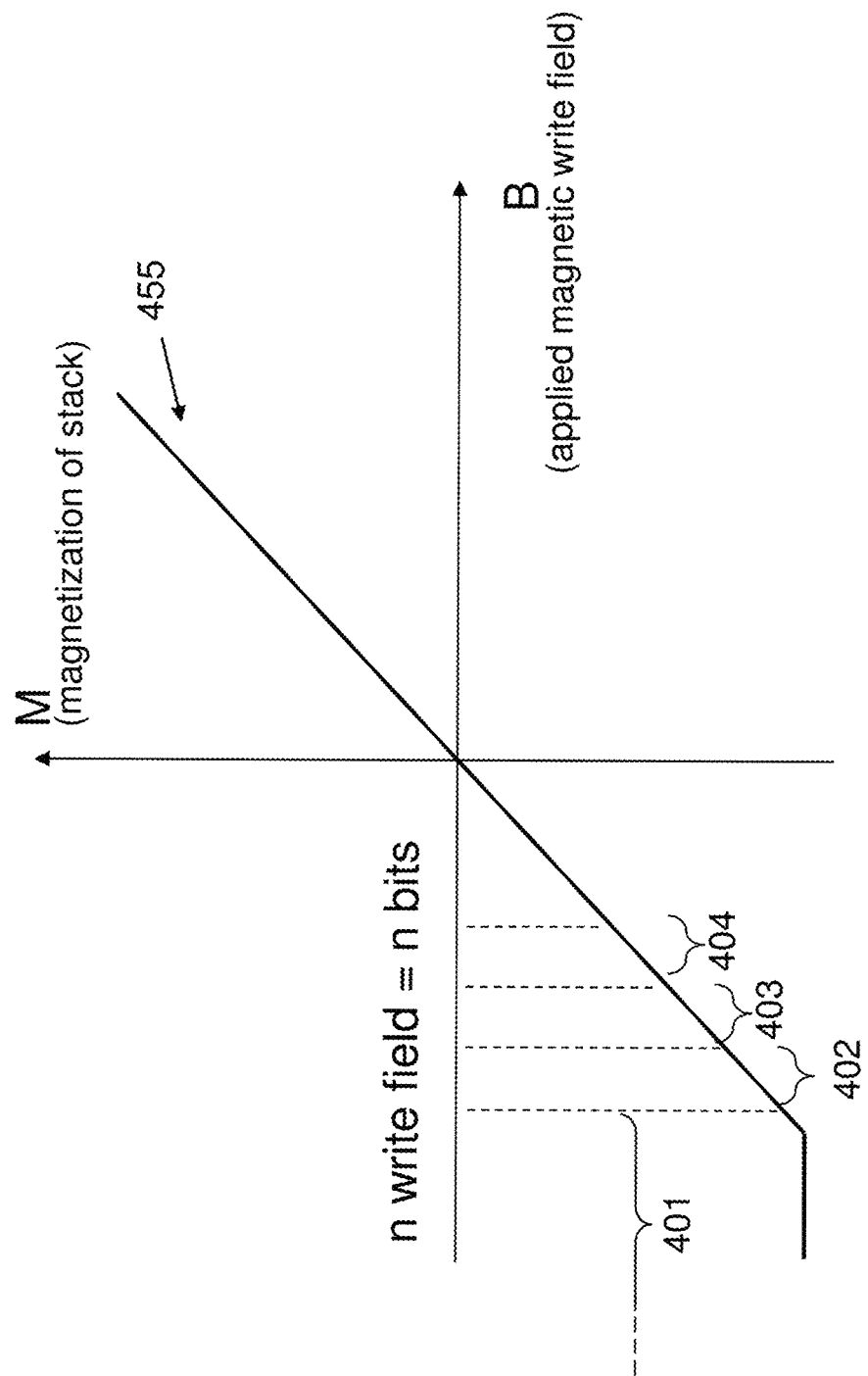
FIG. 4C illustrates a graph of the applied magnetic write field to store each state versus the magnetization of the magnetic tunnel junction according to an embodiment.

According to an embodiment, examples of off axis storage of bits (as states) in the storage layer 12 are provided below. FIGS. 4A, 4B, and 4C (generally referred to as FIG. 4) illustrate storing multiple bits in the MRAM device 100 according to an embodiment. FIG. 4A depicts 4 states for storing bits in the storage layer 12. The magnetic orientations of the open arrow and the solid arrow can be stored in various off axis positions, and are not limited to the anisotropic axis of the storage layer 12 (i.e., not limited to being parallel to the anisotropic axis of the top and bottom ferromagnets 22 and 26). In this case, FIG. 4B shows that the anisotropic axis of the storage layer 12 is vertical (or not horizontal). This means the anisotropic axis of the storage layer 12 is 90° from the anisotropic axis of the ferromagnetic sense layer 16.

The states shown for the storage layer 12 in FIG. 4A are state 401, state 402, state 403, and state 404. For explanation purposes, it is again assumed that the anisotropic axis for the ferromagnetic sense layer 16 is horizontal, and the ferromagnetic sense layer 16 (initially) has a magnetic orientation pointing right for each of the states 401 through 404. Note that the magnetic orientation of the ferromagnetic sense layer 16 may be flipped to the left during the writing and/or reading process (as desired), which changes the resistance of the MTJ 10.

For state 401 stored in the storage layer 12, the open arrow magnetic orientation (of the top ferromagnetic layer 22) is off axis (e.g., pointing at approximately 9:05), and the solid arrow magnetic orientation (of the bottom ferromagnetic layer 26) is off axis (e.g., pointing at approximately 8:55). FIG. 4C illustrates a graph 450 of the applied magnetic write field (B) (e.g., via the magnetic write field generating device 80) on the x-axis versus the magnetization (M) of the MTJ 10 stack on the y-axis.

State 401 corresponds to the portion of the curve 455 identified as state 401 at which the applied magnetic (B) field is the most negative on the x-axis, while magnetization (M) of the stack (MTJ 10) is most negative on the y-axis. The magnetic moment of the ferromagnetic sense layer 16 is pointing right as noted above. State 401 in the curve 455 illustrates the applied magnetic write field as applied by the magnetic write field generating device 80, which is utilized to store the off axis magnetic orientations shown by the open arrow and solid arrow in the storage layer 12.

For state 402 stored in the storage layer 12, the open arrow magnetic orientation (of the top ferromagnetic layer 22) is off axis (e.g., pointing at approximately 9:15), and the solid arrow magnetic orientation (of the bottom ferromagnetic layer 26) is off axis (e.g., pointing at approximately 8:30). State 402 corresponds to the portion of the curve 455 identified at state 402, which includes a negative applied magnetic (B) fields on the x-axis, while magnetization (M) of the stack (MTJ 10) is negative. The magnetic moment of the ferromagnetic sense layer 16 is pointing right as noted above. State 402 in the curve 455 illustrates the applied magnetic write field as applied by the magnetic write field generating device 80 that is utilized to store the magnetic orientations shown by the open arrow and solid arrow in the storage layer 12.

For state 403 stored in the storage layer 12, the open arrow magnetic orientation (of the top ferromagnetic layer 22) is off axis (e.g., pointing at approximately 10 o'clock), and the solid arrow magnetic orientation (of the bottom ferromagnetic layer 26) is on axis (e.g., pointing at approximately 8 o'clock). State 403 corresponds to the portion of the curve 455 identified at state 403, which includes positive applied magnetic (B) fields on the x-axis, while magnetization (M) of the stack (MTJ 10) is positive. The magnetic moment of the ferromagnetic sense layer 16 is pointing right as noted above. State 403 in the curve 455 illustrates the applied magnetic write field as applied by the magnetic write field generating device 80, which is utilized to store the on axis magnetic orientations shown by the open arrow and solid arrow in the storage layer 12.

For state 404 stored in the storage layer 12, the open arrow magnetic orientation (of the top ferromagnetic layer 22) is off axis (e.g., pointing at approximately 11 o'clock), and the solid arrow magnetic orientation (of the bottom ferromagnetic layer 26) is off axis (e.g., pointing at approximately 7:30). State 404 corresponds to the portion of the curve 455 identified at state 404, which includes negative applied magnetic (B) fields on the x-axis, while magnetization (M)

of the stack (MTJ 10) is negative. The magnetic moment of the ferromagnetic sense layer 16 is pointing right as noted above. State 404 in the curve 455 illustrates the applied magnetic write field as applied by the magnetic write field generating device 80, which is utilized to store the on axis magnetic orientations shown by the open arrow and solid arrow in the storage layer 12.

When measuring the magnetic tunnel junction 10 (by measuring the resistance of the MRAM device 100 via voltage source 70 and ammeter 75), each of the 4 states has two measured resistance values: a first resistance value (kΩ) when the ferromagnetic sense layer 16 is pointing to the right and a second resistance value (kΩ) when the ferromagnetic sense layer 16. Accordingly, state 401 (while the magnetic orientations of the top and bottom ferromagnetic 22 and 26 do not change) has two measured resistance values one higher than the other, state 402 (while the magnetic orientations of the top and bottom ferromagnetic 22 and 26 do not change) has two measured resistance values one higher than the other resistance value, similarly state 403 (while the magnetic orientations of the top and bottom ferromagnetic 22 and 26 do not change) has two measured resistance values one higher than the other, and likewise state 404 (while the magnetic orientations of the top and bottom ferromagnetic 22 and 26 do not change) has two measured resistance values one higher than the other.

In this embodiment, states are obtained by continuously varying the applied magnetic field from small to large values using only a single polarity (positive or negative; negative fields are labeled). Typical field values for (401-404) are: 401 is greater than (>) −100 Oe, 402 is approximately (~) 25 Oe, 403 is approximately (~) 25 Oe, and 404 is approximately (~) 25 Oe.

In order to adjust $H_c$, $H_{sf}$, and $H_{sat}$, the thickness and the saturation magnetization of the top and bottom ferromagnetic layers 22 and 26 must be adjusted. The saturation magnetization can be tuned by changing the materials type; materials such as CoFe, CoFeB, and NiFe are useful. The typical thicknesses can range from 10 to 50 Å for each ferromagnetic layer 22 and 26.

Discussion is now directed to writing data to the MRAM device 100 with variable write time and bit density trade-off. The system makes uses of an iterative write-check-write process discussed further below.

By varying the (magnetic) write field on the magnetic field line, several distinct resistance states of the MRAM device 100 can be accessed. Each (predetermined) resistance may have a range/tolerance of, e.g., 5 ohms (Ω) and still be designated the resistance. As such, each resistance is encoded as a state in the memory (i.e., in the MTJ 10, which may be considered a memory cell). In one case, the MRAM device 100 is configured to encode 3 bits; this requires 8 resistance states, where $2^3$=8. In general, to store N bits in the MRAM device, $2^N$ distinct resistance states are needed. Each bit can be logical high (1) or low (0) where (1) and (0) are distinct values of the resistance of the MRAM device 100, which correspond to distinct orientations of the storage layer 12 (e.g., the top ferromagnetic layer 22 of the storage layer 12 in the case of a multilayer storage layer) with respect to the ferromagnetic sense layer 16.

With regard to bit density versus write time, since the bit density of the MRAM device 100 depends on the ability to incrementally adjust the magnetic orientation of the storage layer 12 (as noted above the magnetic orientation of the storage layer 12 is determined by the magnetic orientation of the top ferromagnetic layer 22 depicted by the open arrow) with respect to the ferromagnetic sense layer 16, and since this relative orientation is a function of the write field magnitude (and possibly the direction of the applied (magnetic) field), and because this relative orientation is a result of a magnetostatic interaction rather than a dynamic one, the bit density for the MRAM device 100 is set by the precision with which a control circuit (the magnetic write field generating device 80) can set the magnetic write field and by the precision with which the read circuit (e.g., the voltage source 70 and ammeter 75) can resolve the various resistance states that result from various relative orientations. That is, the maximum bit density is determined primarily by the CMOS drive circuitry in the magnetic write field generating device 80 and readout circuitry (via 70 and 75). This provides for a wide range of tuneability whereby maximum bit density can be traded off with read and write time to optimize the same memory cell for various applications.

Figure 5:
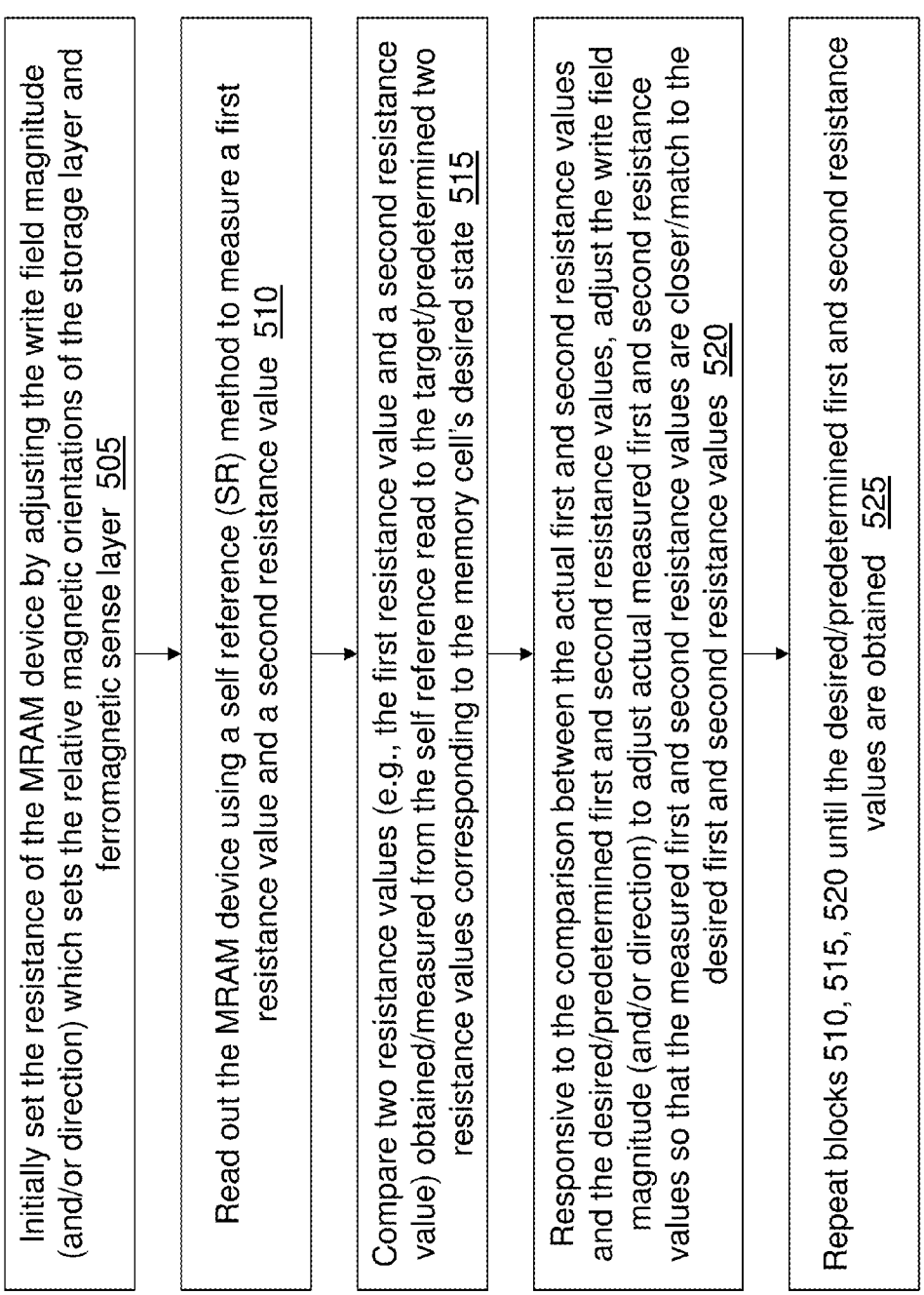
FIG. 5 illustrates a process for writing the multibit thermally assisted magnetoresistive random access memory device according to an embodiment.

In particular, a multistep write process may be used for the iterative write-read-write process. For example, FIG. 5 illustrates a process 500 for writing the multibit TAS MRAM device 100 according to an embodiment. Note that the MRAM device 100, the magnetic write field generating device 80, and readout circuitry (e.g., the voltage source 70 and ammeter 75) may each be implemented in a computer 1000 discussed below, as would be understood by one skilled in the art. Reference can be made to FIGS. 1-4 and 10 (along with FIG. 6 discussed below). In order to thermally write the cells, the different applied fields described previously are applied simultaneously with a heating voltage pulse. This heating voltage raises the temperature of the device to greater than the blocking temperature of the antiferromagnetic layer that exchange biases the SAF storage layer, which depins the storage layer. This allows the storage layer magnetization to be reoriented with the applied magnetic write field. The heating voltage is then reduced back to zero, and the storage layer re-pinned by exchange bias into the new position after the device cools below the blocking temperature of the antiferomagnetic pinning layer.

For example, the magnetic write field generating device 80 (e.g., in the computer 1000) initially sets the resistance of the MRAM device 100 for a desired/predefined state by adjusting the write field magnitude (and/or direction) which sets the relative magnetic orientations of the storage layer 12 and ferromagnetic sense layer 16 at block 505. The desired state has a desired/predetermined first resistance value and a desired/predetermined second resistance value.

The MRAM device 100 may be read out using a self reference (SR) method (via the computer 1000) to measure a first resistance value and a second resistance value at block 510. For example, a small voltage (not large enough to substantially heat the device) is applied by the voltage source 70 so that current flows through the MRAM device 100, and the first resistance value is measured when the magnetic orientation of the ferromagnetic sense layer 16 points in the first direction (e.g., point to the right). Next, while the magnetic orientation of the storage layer 12 remains unchanged (e.g., the magnetic orientations of the top and bottom ferromagnetic layer 22 and 26 stay in their same respective positions), the magnetic orientation of the ferromagnetic sense layer 16 is flipped to the second (opposite) direction (e.g., pointing left), and the second resistance value is measured. The (magnetic orientation of the) storage layer 12 remains fixed because it is pinned by the antiferromagnetic layer 30, and the voltage applied to the MRAM MTJ device 100 during writing is much smaller than the write voltage, and therefore is not large enough to heat the device 100 substantially and depin the storage layer form the antiferomagnetic pinning layer. The read field is of similar magnitude to the write field.

At block 515, the computer 1000 may compare two measured resistance values (e.g., the first resistance value and the second resistance value) obtained/measured from the self reference read to the target/predetermined two resistance values corresponding to the memory cell's desired state. Each state, such as states 201, 202, 203, 204, states 301, 302, 303, 304, and states 401, 402, 403, 404, has two resistance values relative to the magnetic orientation of the ferromagnetic sense layer 16. As such, when the magnetic orientation is in a first direction (e.g., pointing right) the resistance value of the MRAM device 100 is the first resistance value, and when the magnetic orientation is in the second direction (e.g., pointing left) which is opposite the first direction, the resistance value of the MRAM device 100 is the second resistance value.

At block 520, responsive to the comparison (by the computer 1000) between the actual first and second resistance values and the desired/predetermined first and second resistance values, the computer 1000 is configured to adjust the write field magnitude (and/or direction) to adjust actual measured first and second resistance values so that the measured first and second resistance values are closer to the desired first and second resistance values. The graphs 250, 350, and 450 show examples of how the write field magnitude can be adjusted to achieve each state. Each state has a range for the magnitude of the magnetic write field that can be applied, so the write field magnitude may need to be moved in the center of the range for the desired state and/or applied throughout the entire range.

Blocks 510, 515, and 520 are iteratively repeated until the desired/predetermined first and second resistance values are obtained within a threshold and/or tolerance at block 525.

This bit density versus write time optimization may be done once for a specific application of the device, or it may be done dynamically in situ in response to system/device performance demands, energy management scheme, etc.

Other modes of operation may be utilized for the multibit TAS MRAM device 100. For example, it can also be appreciated that instead of using this MRAM device 100 as a digital memory device with specific resistance states, the MRAM device 100 may be used in an analog fashion, where a continuum of resistance is available upon programming. In this respect, this MRAM device 100 may be especially well suited to other applications in analog and mixed signal integrated circuitry, and in novel computing paradigms such as neural-network computing.

Figure 6:
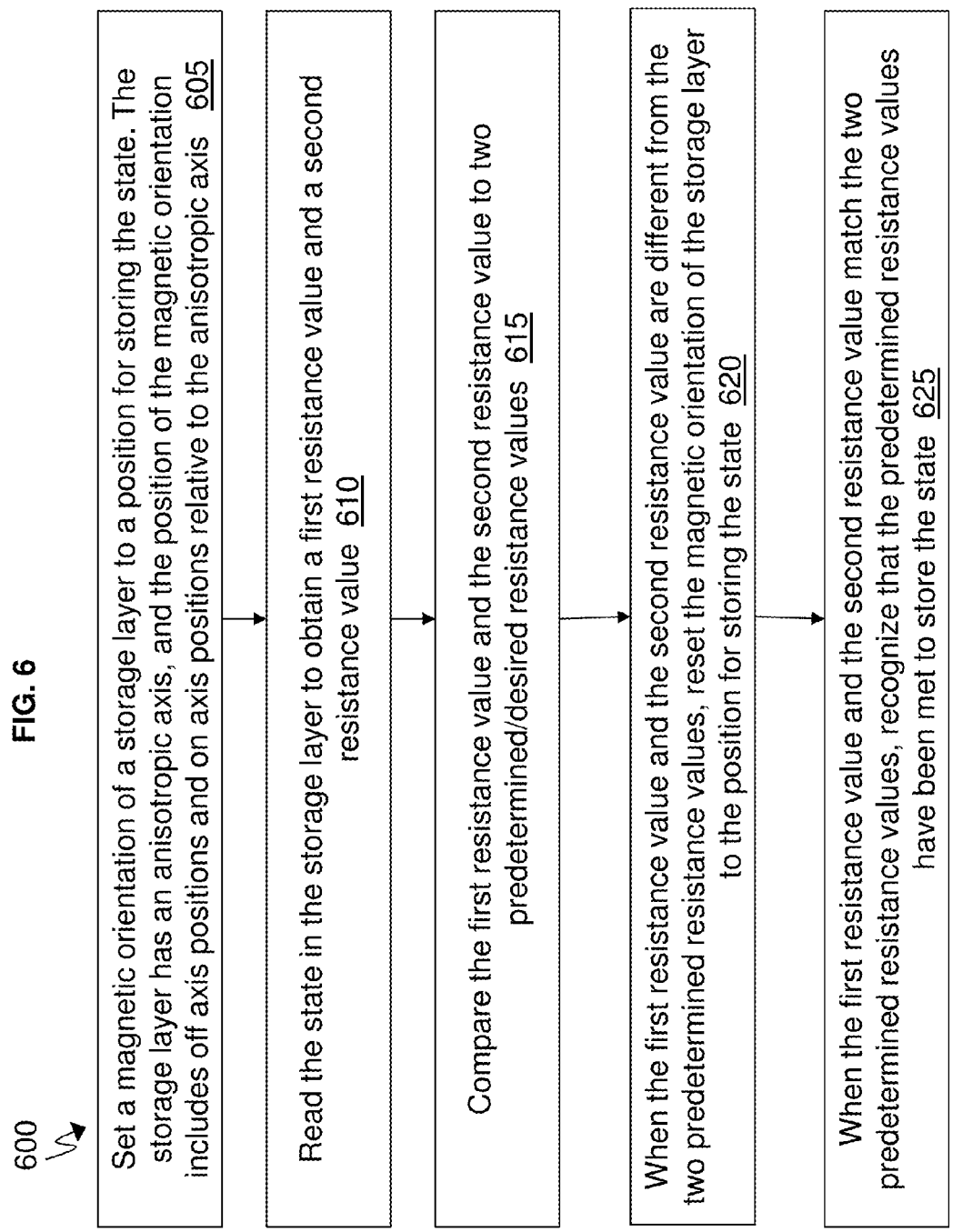
FIG. 6 illustrates a method for writing data in a state in the multibit thermally assisted magnetoresistive random access memory device according to an embodiment.

Now turning to FIG. 6, a method 600 is provided for writing data in a state in a multibit thermally assisted magnetoresistive random access memory device 100 according to an embodiment. In order to thermally write the cells, the different applied fields described previously are applied simultaneously with a heating voltage pulse. This heating voltage raises the temperature of the device to greater than the blocking temperature of the antiferromagnetic layer that exchange biases the SAF storage layer, which depins the storage layer. This allows the storage layer magnetization to be reoriented with the applied magnetic write field. The heating voltage is then reduced back to zero, and the storage layer re-pinned by exchange bias into the new position after the device cools below the blocking temperature of the antiferromagnetic pinning layer.

The computer 1000 (via magnetic write field generating device 80) sets a magnetic orientation of the storage layer 12 (e.g., open arrow) to a position for storing the state (e.g. the desired state may be state 201, but any one of the states 201, 202, 203, 204, states 301, 302, 303, 304, and states 401, 402, 403, 404 (or other states not shown) can be selected) where the storage layer 12 has an anisotropic axis, and where the position (e.g., such as the hands on a clock and/or the degrees in the circle for storage layer 12 shown in FIGS. 2-4) of the magnetic orientation includes (any selection from) off axis positions and on axis positions relative to the anisotropic axis at block 605.

The computer 1000 (via voltage source 70 and ammeter 75) reads the state stored in the storage layer 12 to obtain a first resistance value and a second resistance value at block 610.

At block 615, the computer 1000 compares the first resistance value and the second resistance value to predetermined resistance values (which may be a first desired resistance value and second desired resistance value both values of which are known in advance).

At block 620, when the first resistance value and the second resistance value are different from the predetermined resistance values (different from the first and second desired resistance values), the computer 1000 is configured to reset the magnetic orientation (open arrow) of the storage layer 12 to the desired position for storing the state. For example, the computer 1000 may adjust the magnetic write field (B field) shown in FIGS. 2C, 3C, and 4C in order to achieve the desired state.

At block 625, when the first resistance value and the second resistance value match (within a threshold and/or tolerance) the predetermined resistance values, the computer 1000 recognizes that the predetermined resistance values have been met to store the desired state (e.g., such as state 201). Matching the first and second resistance values to the predetermined resistance values (i.e., the first and second desired resistance values) verifies that the state (i.e., data) has been stored in the storage layer 12, and thus no further adjustments to the magnitude of the magnetic write field (B field) are needed.

The off axis positions define the desired magnetic orientation of the storage layer 12 as being aligned off the anisotropic axis of the storage layer 12. An off axis position for the magnetic orientation means that the magnetic orientation of the storage layer 12 is not parallel to the anisotropic axis (e.g., such as states 201, 204 in FIG. 2A relative to the anisotropic axis of the storage layer 12 shown in FIG. 2B, states 301-304 in FIG. 3A relative to the anisotropic axis shown in FIG. 3B, and states 401-404 in FIG. 4A relative to the anisotropic axis shown in FIG. 4B).

The magnetic orientation of the storage layer 12 is aligned off the anisotropic axis by a range of 1 to 179 degrees such that the magnetic orientation is not parallel to the easy axis. However, if the magnetic orientation is off axis by 0 degrees and/or 180 degrees, this would be defined or the same as being on the anisotropic axis (i.e., parallel to the anisotropic axis).

A given off axis position storing the desired state has a magnetic orientation in the storage layer, and the given off axis position is associated with a first resistance value (10 kΩ) and a second resistance value (30 kΩ). The first resistance value corresponds to and is measured (by the computer 1000) relative to a first magnetic orientation of the ferromagnetic sense layer 16 (e.g., right pointing magnetic orientation). The second resistance value corresponds to and is measured (by the computer 1000) relative a second magnetic orientation of the ferromagnetic sense layer, and the second magnetic orientation (e.g., left pointing magnetic orientation) is aligned in an opposite position to the first magnetic orientation of the ferromagnetic sense layer 16.

The state stored is determined by the first resistance value and the second resistance value. Each state has two resistance values, where each is measured relative to different/opposite pointing magnetic orientations of the ferromagnetic sense layer 16.

As noted above, the amount of power required to heat the device to $T_{write}$ is strongly dependent on the thermal conductivity between the device and the surrounding structures and substrate, which are at $T_{op}<T_{write}$. For typical devices and structures, the power required is undesirably large.

In particular, the TAS-MRAM cell is composed of a magnetic tunnel junction with an antiferromagnetic (AF) pinning layer. This AF layer must be heated to $T_{write}>T_{op}$ in order to write data to the storage layer (SL) of the TAS-MRAM device.

Embodiments described herein reduce the power required to heat the AF layer of the device to $T_{write}$ by reducing the thermal conductivity between the antiferromagnetic (AF) pinning layer and the surrounding magnetic layers and contact structures. Embodiments utilize interfacial thermal resistance (sometimes referred to as boundary resistance or Kapitza resistance in the literature) in multiple magnetic and non-magnetic layers within (the sense layer of) the magnetic tunnel junction (MTJ) structure, and below the AF layer in a multilayer thermally resistive spacer structure to reduce the thermal conductivity between the AF layer and the surrounding layers and structures.

Empirically and theoretically, thermal resistance is effected differently (and often more strongly) by interfaces than is electrical resistance. This is especially important in metals that are relatively poor electrical conductors compared to pure Cu, Al, etc., since in these poor thermal conductors, thermal conductivity is dominated by phonon transport, whereas in good electrical conductors, thermal conductivity is dominated by electron transport and obeys the Wiedemann-Franz law, displaying a proportionality between electrical and thermal conductivity.

In relatively poorly conducting metals, the relative importance of phonons in thermal transport is much higher than in materials with relatively high electrical conductivity. For example, in TaN with even a modest nitrogen concentration, the contribution of electrons and phonons to thermal conductivity is of similar magnitude; for more resistive TaN (commonly used in TAS-MRAM device), phonon thermal conductivity can dominate thermal transport. Interfaces, lattice mismatches, amorphous layers, etc., strongly effect phonon transport; however, if the interfaces do not present a significant discontinuity in the density of electronic conducting states (which is often the case for multilayer conductors), then they will not strongly effect electron transport. Therefore, in relatively electrically resistive metals, in particular metal nitrides, interfaces can provide a way of significantly reducing the thermal conductivity of the stack independently from the electrical conductivity, enabling multiple-interface materials/structures to have small thermal conductance but similarly large electrical conductance to materials/structures with fewer interfaces.

Figure 7:
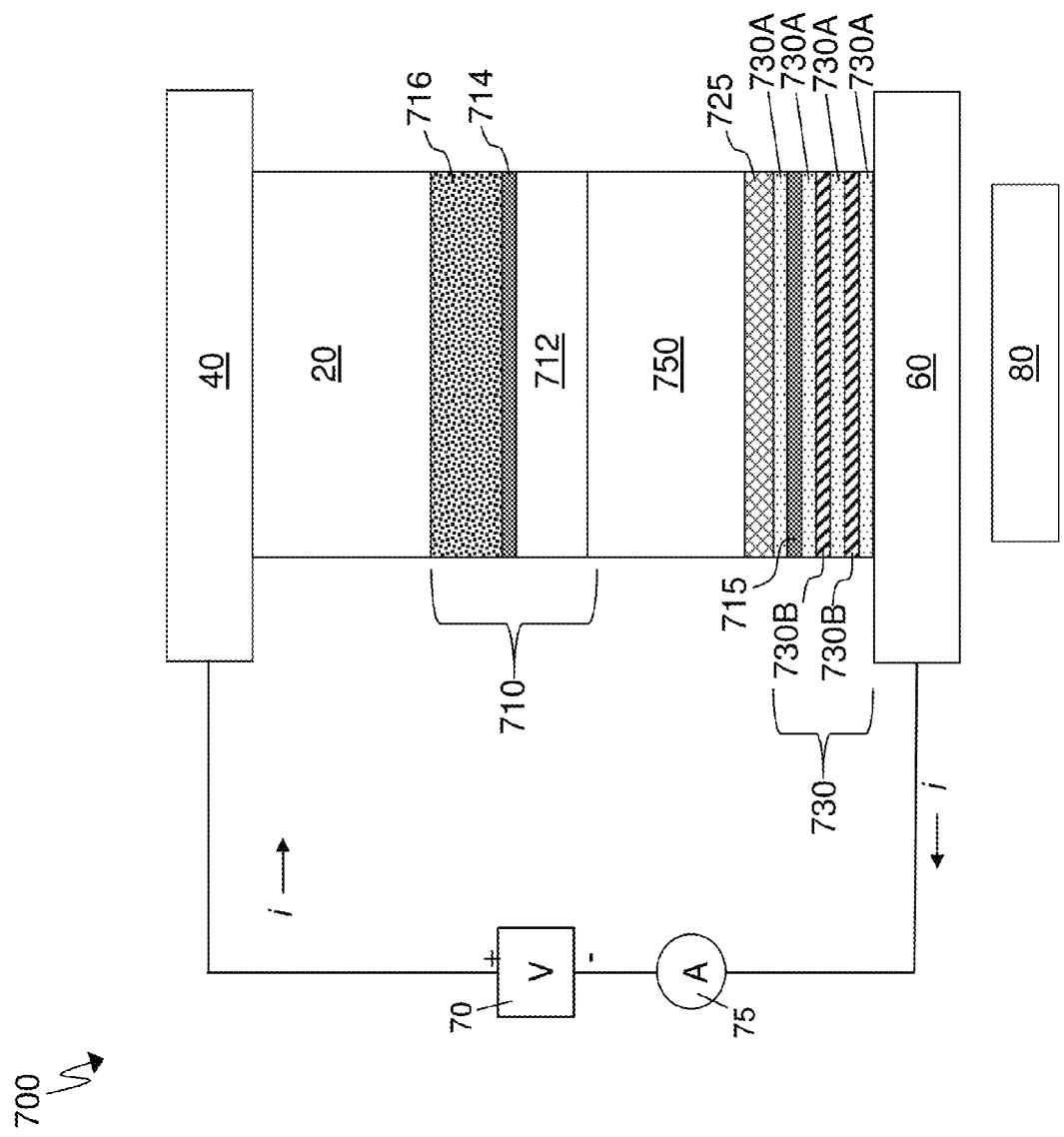
FIG. 7 is a cross-sectional view of a thermally-assisted magnetoresistive random access memory (TAS-MRAM) device according to an embodiment.

FIG. 7 illustrates a structure for a thermally-assisted magnetoresistive random access memory (TAS-MRAM) device 700 according to an embodiment.

The structure of the MRAM device 700 includes a magnetic tunnel junction (MTJ) 710. The magnetic tunnel junction 710 may include a storage layer 712 with a non-magnetic tunnel barrier 714 disposed on top of the storage layer 712. The magnetic tunnel junction 710 also includes a ferromagnetic sense layer 716 disposed on top of the non-magnetic tunnel barrier 714. The non-magnetic tunnel barrier 714 may be a semiconductor or insulator with a high resistance. The storage layer 712 may be a ferromagnetic layer.

A contact structure 20 is disposed on the top of magnetic tunnel junction 10 in order to connect the magnetic tunnel junction 710 (MRAM device 700) to a first wire 40. The contact structure 20 may be a hard mask to pattern the layers below, when etching is applied.

The storage layer 712 is disposed on top of an antiferromagnetic (AF) pinning layer 750. The antiferromagnetic pinning layer 750 is an antiferromagnet and may include materials such as, e.g., IrMn, FeMn, PtMn, etc. The antiferromagnetic pinning layer 750 may be composed of two magnetic sublattices. The two magnetic sublattices have opposite magnetic orientations (also referred to as magnetic moments), such that the net magnetic moment of the antiferromagnetic pinning layer 750 is close to zero. Since antiferromagnets have a small or no net magnetization, their magnetic orientation is only weakly influenced by an externally applied magnetic field.

The antiferromagnetic pinning layer 750 is disposed on top of a seed layer 725. The seed layer 725 is the seed for growing the antiferromagnetic pinning layer 750. Note that the seed layer 725 is optional, and in one implementation, the seed layer 725 may not be present. The seed layer 725, when present, is disposed on top of a multilayer thermally resistive spacer structure 730. When the seed layer 725 is not present, the antiferromagnetic pinning layer 750 is disposed on top of the multilayer thermally resistive spacer structure 730. The multilayer thermally resistive spacer structure 730 is disposed on and/or connected to the second wire 60. The wires 40 and 60 connect the MRAM device 700 to a voltage source 70 (for generating the write bias current to heat the MRAM device 700) and ammeter 75 for measuring current. As such, the resistance of the MTJ 710 (i.e., MRAM device 700) can be determined.

The multilayer thermally resistive spacer structure 730 utilizes a large boundary resistance for heat conduction across interfaces, but the relatively efficient electrical conduction across interfaces, to make an efficient heat barrier for the TAS-MRAM device 700. This also applies to the multilayer ferromagnetic sense layer 716 observed in FIG. 8.

For example, the electrically conducting multilayer thermally resistive spacer structure 730 has multiple layers of metal (e.g., at least two or more) shown as different metal layers 730A and 730B. In one case, each of the individual metal layers 730A and 730B of the multilayer thermally resistive spacer structure 730 may each be a different metal or metal alloy. Note metal layers 730A and 730B may be a metal (with standard impurities as understood by one skilled in the art), metal alloys, and combinations of both. Metals used in the metal layers 730A and 730B may include Ta, TaN, NiCr, NiCrN, and other resistive metals and their nitrides. These specific materials listed are useful because they provide a good base for the other magnetics layers to grow, and because their resistance is high enough to limit the non-interfacial contribution to thermal conductivity without being so high as to add significant series electrical resistance to the device.

In one case, the metal layers 730A and 730B may switch repeatedly between two alternating metals/metal alloys, such as Ta (e.g., metal layer 730A) and TaN (e.g., metal layer 730B). Also, the metal layers 730A and 730B may alternate among 3, 4, 5, 6, 7, etc., different metal layers in the multilayer thermal resistive contact structure 730, where the interface between each metal layer 730A and 730B is between two different metals/metal alloys (i.e., for different conducting materials). That is, no two of the same electrically conducting materials interface with one another (e.g., are disposed on top of one another) in the metal layers 730A and 730B. If metal layer 730A is gold, then metal layer 730B interfacing (i.e., touching metal layer 730A) is not gold in one case. This principle of not having the same electrically conducting materials interfacing one another occurs throughout the metal layers 730A and 730B of multilayer thermal resistive contact structure 730 (as well as the ferromagnetic sense layer 716 discussed in FIG. 8).

Also, note that the multilayer thermal resistive contact structure 730 may optionally include a non-magnetic tunnel barrier 715 (similar to the non-magnetic tunnel barrier 714). When included, the non-magnetic tunnel barrier 715 may be a semiconductor or insulator with a high resistance that provides Joule heating. This second non-magnetic tunnel barrier 715 acts as a second source of Joule heat during writing. This is useful in some configurations of TAS-MRAM that require high write temperatures.

As an example, the thickness of each individual metal layer 730A and 730B may be between 5 Å (angstroms) to 50 Å thick. The total thickness of the entire multilayer thermally resistive spacer structure 730 (i.e., the combined thickness of all of the repeating metal layers 730A and 730B) may be between 2 to 50 nm (nanometers).

Further, the metal layers 730A and 730B should have a number of interfaces, e.g., two or more (with non-touching metal layers of the same material). An interface is where one metal layer 730A meets/contacts a different metal layer 730B (which alternates as seen in FIG. 7). Each interface (of different materials) in the metal layers 730A and 730B works to inhibit the escape of heat in the multilayer thermally resistive spacer structure 730 by hindering/restricting the flow of phonons between the interfaces.

A phonon is a collective excitation in a periodic, elastic arrangement of atoms or molecules in condensed matter, such as solids and some liquids. Often referred to as a quasiparticle, the phonon represents an excited state in the quantum mechanical quantization of the modes of vibrations of elastic structures of interacting particles. A phonon is a quantum mechanical description of a special type of vibrational motion, in which a lattice uniformly oscillates at the same frequency, and the phonon has both wave-like and particle-like properties. Due to the connections between atoms in a material, the displacement of one or more atoms from their equilibrium positions will give rise to a set of vibration waves propagating through the lattice. The phonons carry heat through the lattice vibration. The lattice vibrations work better in a single material as oppose to the multilayers in the multilayer thermally resistive spacer structure 730 (and the multilayer ferromagnetic sense layer 716 shown in FIG. 2). The multilayer property reduces thermal conductivity, and the interfaces (between the metal layers 730A and 730B) decrease the heat flow by increasing the thermal resistance.

Figure 8:
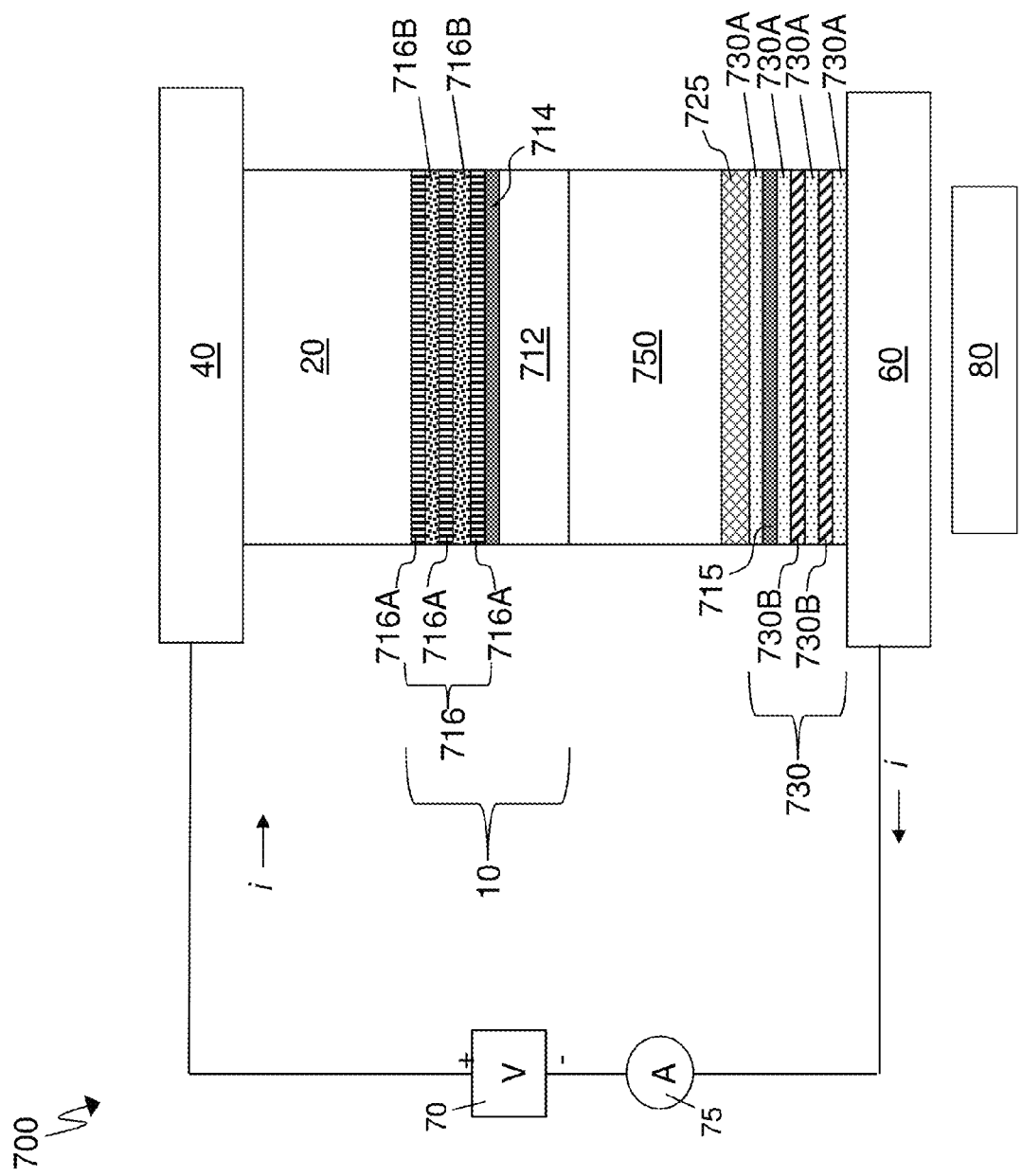
FIG. 8 is a cross-sectional view of a thermally-assisted magnetoresistive random access memory device according to another embodiment.

The multiple interfaces between the multiple metal layers 730A and 730B (as well as between metals 716A and 716B in the multilayer ferromagnetic sense layer 716 shown in FIG. 8) block the flow of heat in the multilayer contact structure 730 by blocking a flow of phonons between the multiple interfaces. Embodiments are configured to decrease the heat loss and this reduction in heat may vary. For example, embodiments may have anywhere from 10-90% reduction in heat loss depending on the types of materials and number of interfaces used.

In one case, the multilayer thermally resistive spacer structure 730 only includes electrically conducting materials of metals and metal alloys. The multilayer thermally resistive spacer structure 730 may be void of air vacuums as thermal insulators, void of semiconductors as thermal insulators, void of glass as thermal insulators, and/or void of dielectrics as thermal insulators.

The multilayer thermal resistive contact structure 730 is patterned to the same dimensions as the above layers. For example, the multilayer thermal resistive contact structure 730 is patterned to the same dimensions (length and width) and/or size as the magnetic tunnel junction 710, when the contact structure 20 is utilized as a hard mask to etch layers 716, 714, 712, 750, 725, 715, and 730 (all of which are under the contact structure 20 although not touching) according to the same pattern.

FIG. 8 illustrates the structure for a thermally-assisted magnetoresistive random access memory (TAS-MRAM) device 700 according to an embodiment. The elements and discussion in FIG. 7 apply to FIG. 8. Additionally, FIG. 8 illustrates a modification to the ferromagnetic sense layer 716. In FIG. 8, the ferromagnetic sense layer 716 has multiple adjacent layers of materials that form interfaces similar to the multilayer thermally resistive spacer structure 730 discussed above. The multilayer ferromagnetic sense layer 716 may include one type of metal layer 716A adjacent to another type of metal layer 716B, which are alternatingly stacked to form the ferromagnetic sense layer 716. In one case, the metal layers 716A are magnetic layers while the metal layers 716B are non-magnetic layers. For example, the metal layers 716A may be ferromagnetic layers while the metal layers 716B are gold, silver, copper, Ta, TaN, NiCr, and/or NiCrN.

Also, in another case, the metal layers 716A are magnetic layers while the metal layers 716B are different magnetic layers. For example, the metal layers 716A may be one ferromagnetic material, and the metal layers 716A may be a different ferromagnetic material. Ferromagnetic materials include iron, nickel, cobalt and most of their alloys, and metal layers 716A may be iron and metal layers 716B may be nickel.

The thickness of each individual metal layer 716A and 716B may be between 2 Å (angstroms) to 12 Å thick. In one case, the thickness of each metal layer 716A and 716B may particularly be 6 Å. Note that the metal layers 716A and 716B in the multilayer ferromagnetic sense layer 716 act as a single sense layer. For example, ferromagnetic coupling cause the metal layers 716A and 716B to act as one. Since the layers 716A and 716B are thin and in close contact with each other, ferromagnetic exchange interactions, understood by one skilled in the art, couple the layers together into a single magnetic layer that switches as a single magnetic moment.

Embodiments described herein in FIGS. 7 and 8 reduce the power (e.g., voltage and/or current generated by a voltage and/or current source 70) required to heat the TAS-MRAM device 700 to $T_{write}$. Power to generate a write current (via the voltage source 70 to heat the MTJ 710 to the write temperature $T_{write}$) is reduced by reducing the heat that escapes through the multilayer thermally resistive spacer structure 730 (below) and/or the multilayer thermally resistive ferromagnetic sense layer 716 (above). Embodiments presented herein utilize interfacial thermal resistance (sometimes referred to as boundary resistance or Kapitza resistance) in the top multilayer ferromagnetic sense layer 716 and bottom multilayer thermally resistive spacer structure 730 of the TAS-MRAM device 700 to provide small thermal conductivity.

The multilayer thermally resistive spacer structure 730 significantly reduces the thermal conductivity (i.e., heat transfer) between the MTJ 710 and the wire 60, while allowing electricity to flow freely through the multilayer thermally resistive spacer structure 730 to the wire 60. Similarly, the multilayer ferromagnetic sense layer 716 significantly reduces the thermal conductivity (i.e., heat transfer) out of the top of the MTJ 710 to the wire 40, while allowing electricity to flow freely between the MTJ 710 and the top wire 40.

Now, the write operation for the MRAM device 700 is discussed. The voltage source 70 produces a voltage, and write bias current (i) flows into the wire 40, into the contact structure 20, through the MTJ 710 (e.g., into the multilayer ferromagnetic sense layer 716 (i.e., though metal layers 716A and 716B), into the antiferromagnetic pinning layer 750, into the seed layer 725, out through the multilayer thermally resistive spacer structure 730 (including the non-magnetic tunnel barrier 715 along with the metal layers 730A and 730B), and out through the bottom wire 60 (back to the voltage source 70). The MTJ 710 (particularly the tunnel barrier 714) (and the optional tunnel barrier 715) has a high resistance compared to the other layers of the MRAM device 700, which causes the Joule heating at the MTJ 710. When the write temperature $T_{write}$ is reached, the heating has placed the ferromagnetic storage layer 712 in condition to have its magnetic orientation flipped or changed by a magnetic field applied by a magnetic field generating device 80. In other words, heating the MTJ 710 to the write temperature $T_{write}$ destabilizes the magnetic orientation of the ferromagnetic storage layer 712 so that the applied magnetic field can flip the magnetic orientation as desired. In one case, the magnetic generating device 80 may be a combination of an (insulated) metal wire connected to a voltage source to generate the magnetic field as understood by one skilled in the art. Also, the magnetic generating device 80 may be a CMOS (complementary metal oxide semiconductor) circuit that generates the magnetic filed as understood by one skilled in the art.

In a conventional MRAM (without the multilayer thermally resistive spacer structure 730 and/or without multilayer ferromagnetic sense layer 716 with metal layers 716A and 716B but having some other type of structure 730 and conventional sense layer), when the write bias current flows through the MTJ 710, the heat generated at the MTJ 710 (e.g., particularly at the tunnel barrier 714) is lost because the heat (i.e., thermal energy) flows away from the MTJ 710 (i.e., flows out through the layer 20 and into layer 40 in one direction and flows out through conventional layer 730 and into layer 60 in the other direction if this were a convention MRAM). This would require the voltage source 70 to generate more power to compensate for the heat loss so that the MTJ 710 can reach the temperature $T_{write}$.

However, in the embodiments discussed herein, the multilayer thermally resistive spacer structure 730 and multilayer ferromagnetic sense layer 716 (having multiple metal layers 716A and 716B) are designed and positioned in the MRAM device 700 to trap the heat in the MTJ 710 from above and below. Trapping the heat in the MTJ 710 is accomplished by the multilayer thermally resistive spacer structure 730 (via metal layers 730A and 730B) blocking heat from flowing out the MTJ 710 at the bottom and by the multilayer thermally resistive ferromagnetic sense layer 716 (via metal layers 716A and 716B) blocking heat from flowing out of the MTJ 710 at the top, all while allowing the write bias current (i) to flow through the MRAM device 700.

For example, when the write bias current flows through the MTJ 710, the heat generated by the MTJ 710 (e.g., particularly at the tunnel barrier 714) is not lost because as the heat (i.e., thermal energy) tries to flow away above the MTJ 710 (i.e., tries to flow toward the layer 20 and into layer 40 in one direction), the interfacing metal layers 716A and 716B of the multilayer thermally resistive ferromagnetic sense layer 716 blocks the flow of heat (as the ferromagnetic sense layer 716 is a thermal insulator to block the heat transfer (while allowing electrical current to flow)). Similarly, as the heat (i.e., thermal energy) tries to flow away below the MTJ 710 (i.e., tries to flow toward the layer 730, layer 750, and layer 60 in the bottom direction), the multilayer thermally resistive spacer structure 730 blocks the flow of heat (as the multilayer thermally resistive spacer structure 730 is a thermal insulator to block the heat transfer (while allowing electrical current to flow)). Accordingly, less heating is needed (because of the reduction in heat loss) which requires the voltage source 70 to generate less power (i.e., voltage) to reach the temperature $T_{write}$ for the MTJ 710.

Figure 9:
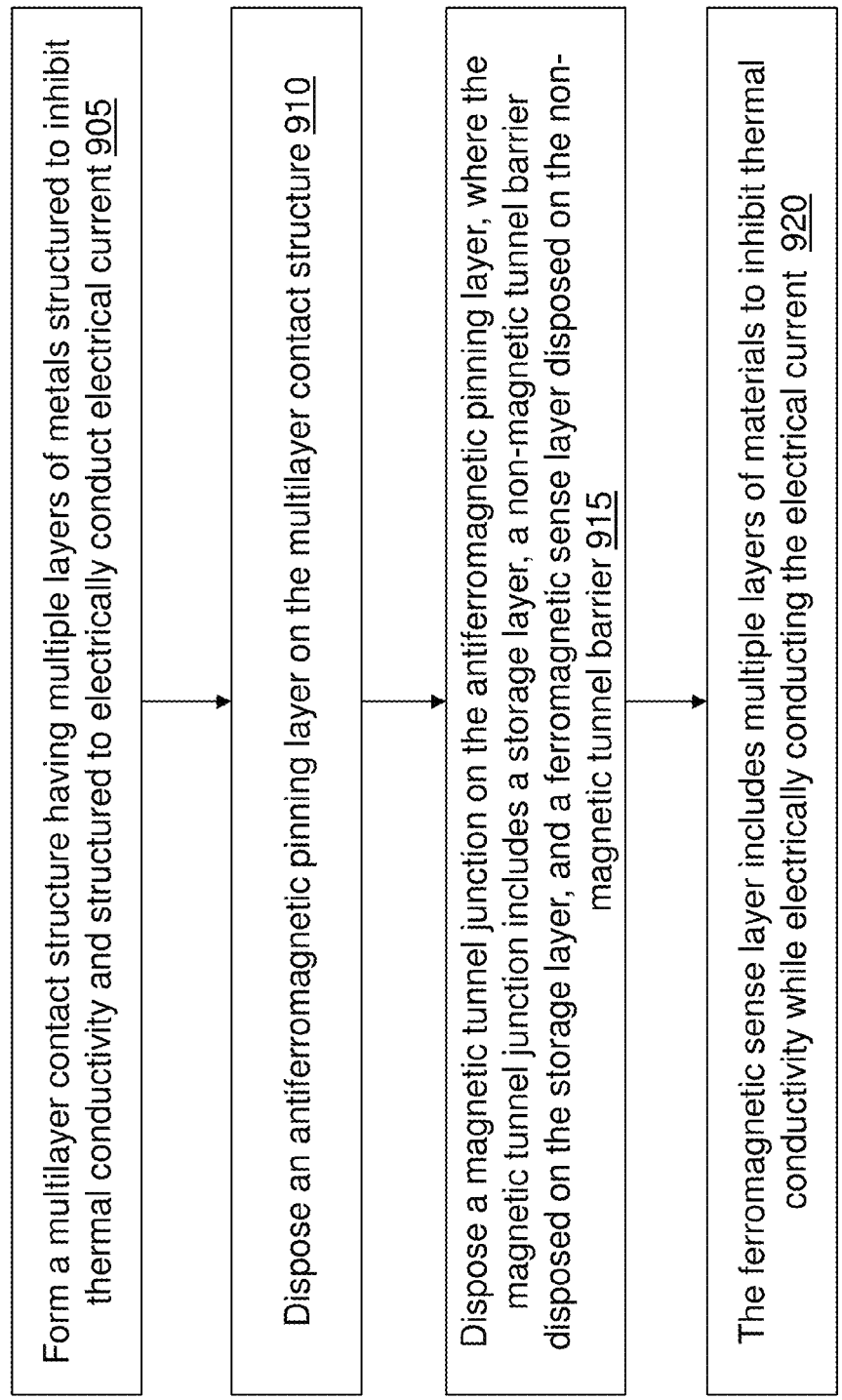
FIG. 9 illustrates a method of forming the MRAM device(s) according to an embodiment, in which the final operation is not required in FIG. 7, but is utilized in FIG. 8.
Figure 10:
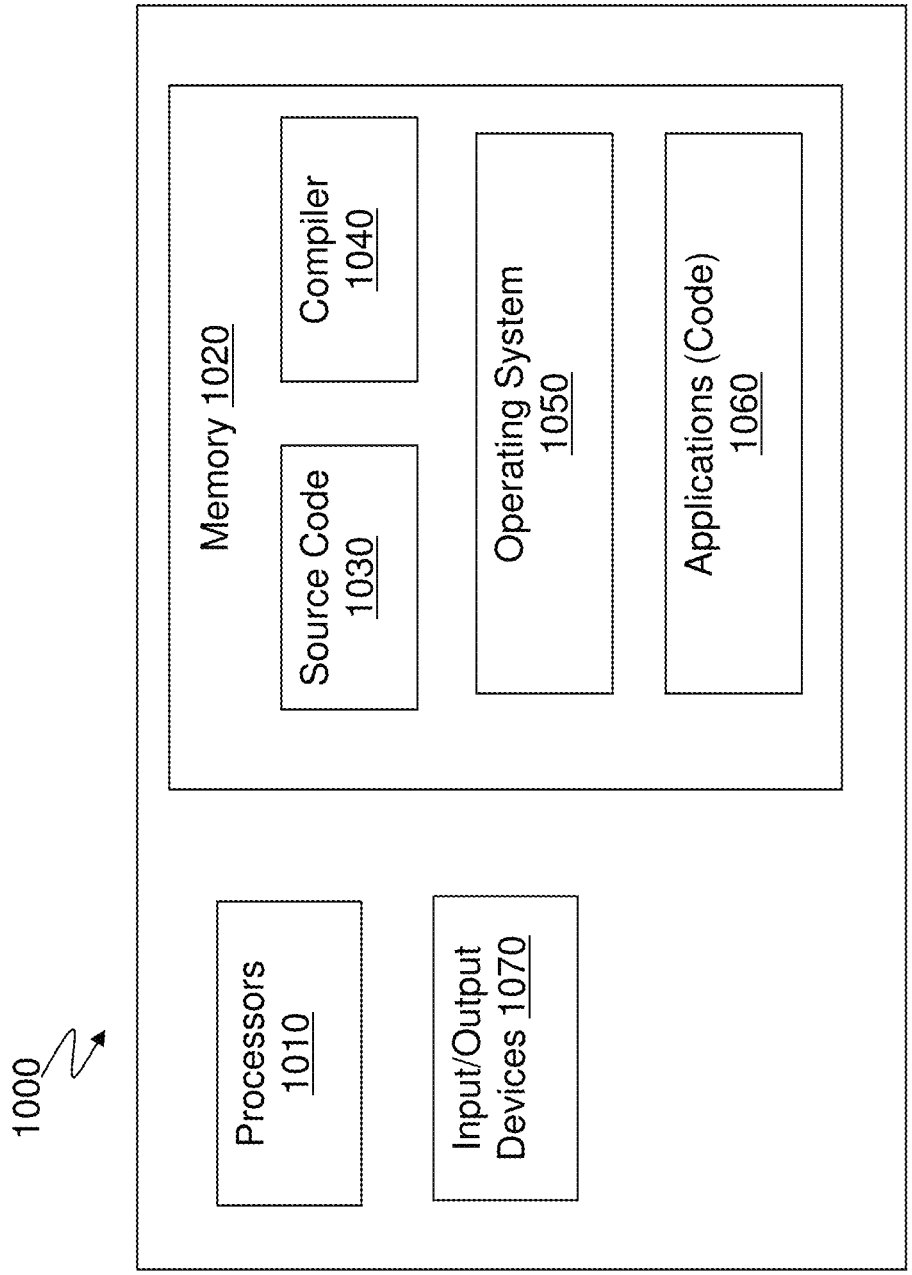
FIG. 10 illustrates an example of a computer which can be connected to, operate, and/or include the MRAM device(s) according to an embodiment.

FIG. 9 illustrates a method 900 of forming the thermally assisted magnetoresistive random access memory device (TAS-MRAM) 700 is provided. Reference can be made to FIGS. 7 and 8 (including FIG. 10 below).

At block 905, a multilayer thermally resistive spacer structure 730 having multiple layers of metals (e.g., metal layers 730A, 730B, then 730A, 730B and so forth) structured to inhibit thermal conductivity, where the multiple layers of metals are structured to electrically conduct electrical current (e.g., the write bias current (i)).

At block 910, the antiferromagnetic pinning layer 750 is disposed on the multilayer thermally resistive spacer structure 730.

At block 915, the magnetic tunnel junction 710 is disposed on the antiferromagnetic pinning layer 750, and the magnetic tunnel junction 710 includes the storage layer 712, the non-magnetic tunnel barrier 714 disposed on the storage layer 712, and a ferromagnetic sense layer 716 disposed on the non-magnetic tunnel barrier 714.

At block 920, the ferromagnetic sense layer 716 includes multiple layers of materials (e.g., multiple adjacent metal layers 716A and 716B) to inhibit thermal conductivity while electrically conducting the electrical current.

The multiple layers of metals include multiple interfaces between the multiple layers of metals (e.g., an interface is where metal layer 730A meets/touches metal layer 730B in the multilayer thermally resistive spacer structure 730), where the multiple layers of metals conduct the electrical current through the multiple interfaces when voltage (via voltage source 70) is applied. The multiple interfaces between the multiple layers of metal 730A and 730B block a flow of heat in the multilayer contact structure 730 by blocking a flow of phonons between the multiple interfaces.

The MRAM device 700 includes the hard mask 20 (i.e., contact structure) disposed on top of the magnetic tunnel junction 710. The same pattern of the magnetic tunnel junction 710, the antiferromagnetic pinning layer 750, and the multilayer spacer structure 730 is patterned based on dimensions of the contact structure 20 (e.g., hard mask) above. The multilayer spacer structure 730 only includes electrically conducting materials as the multiple layers of metals. The multiple layers of metals include metal alloys. The multilayer spacer structure 730 includes a non-magnetic tunnel barrier 715 in between any two of the multiple layers of metals. The magnetic tunnel junction includes a storage layer, a non-magnetic tunnel barrier disposed on the storage layer, and a ferromagnetic sense layer disposed on the non-magnetic tunnel barrier.

With regard to the multilayer ferromagnetic sense layer 716 discussed in FIG. 8, the multiple layers of materials include at least two different interfacing magnetic layers 716A and 716B in a stack to form the ferromagnetic sense layer 716. The multiple layers of materials include multiple interfaces respectively between multiple layers of magnetic layers 716A and 716B. Each meeting/touching location of metal layers 716A and 716B is an interface in the multilayer ferromagnetic sense layer 716. The multiple layers of materials include alternating layers of magnetic layers 716A and non-magnetic layers 716B in a stack to form the ferromagnetic sense layer 716, and the multiple layers of materials include multiple interfaces between the alternating layers of magnetic layers and non-magnetic layers.

FIG. 1000 illustrates an example of a computer 1000 (which may include one or more MRAM devices 100 and 700) having capabilities, which may be included in exemplary embodiments. The MRAM device 100, 700 may be constructed in a memory array as understood by one skilled in the art (for reading and writing data), and the memory array may be part of the computer memory 1020 discussed herein. Various methods, procedures, circuits, elements, and techniques discussed herein may also incorporate and/or utilize the capabilities of the computer 1000. One or more of the capabilities of the computer 1000 may be utilized to implement, to incorporate, to connect to, and/or to support any element discussed herein (as understood by one skilled in the art) in FIGS. 1-9.

Generally, in terms of hardware architecture, the computer 1000 may include one or more processors 1010, computer readable storage memory 1020, and one or more input and/or output (I/O) devices 1070 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 1010 is a hardware device for executing software that can be stored in the memory 1020. The processor 1010 can be virtually any custom made or commercially available processor, a central processing unit (CPU), a data signal processor (DSP), or an auxiliary processor among several processors associated with the computer 1000, and the processor 1010 may be a semiconductor based microprocessor (in the form of a microchip) or a microprocessor.

The computer readable memory 1020 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1020 may incorporate electronic, magnetic, optical, and/or other types of storage media. Note that the memory 1020 can have a distributed architecture, where various components are situated remote from one another, but can be accessed by the processor 1010.

The software in the computer readable memory 1020 may include one or more separate programs, each of which comprises an ordered listing of executable instructions for implementing logical functions. The software in the memory 1020 includes a suitable operating system (O/S) 1050, compiler 1040, source code 1030, and one or more applications 1060 of the exemplary embodiments. As illustrated, the application 1060 comprises numerous functional components for implementing the features, processes, methods, functions, and operations of the exemplary embodiments. The application 1060 of the computer 1000 may represent numerous applications, agents, software components, modules, interfaces, controllers, etc., as discussed herein but the application 1060 is not meant to be a limitation.

The operating system 1050 may control the execution of other computer programs, and provides scheduling, input-output control, file and data management, memory management, and communication control and related services.

The application 1060 may be a source program, executable program (object code), script, or any other entity comprising a set of instructions to be performed. When a source program, then the program is usually translated via a compiler (such as the compiler 1040), assembler, interpreter, or the like, which may or may not be included within the memory 1020, so as to operate properly in connection with the O/S 1050. Furthermore, the application 1060 can be written as (a) an object oriented programming language, which has classes of data and methods, or (b) a procedure programming language, which has routines, subroutines, and/or functions.

The I/O devices 1070 may include input devices (or peripherals) such as, for example but not limited to, a mouse, keyboard, scanner, microphone, camera, etc. Furthermore, the I/O devices 1070 may also include output devices (or peripherals), for example but not limited to, a printer, display, etc. Finally, the I/O devices 1070 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 1070 also include components for communicating over various networks, such as the Internet or an intranet. The I/O devices 1070 may be connected to and/or communicate with the processor 1010 utilizing Bluetooth connections and cables (via, e.g., Universal Serial Bus (USB) ports, serial ports, parallel ports, FireWire, HDMI (High-Definition Multimedia Interface), etc.).

When the computer 1000 is in operation, the processor 1010 is configured to execute software stored within the memory 1020, to communicate data to and from the memory 1020, and to generally control operations of the computer 1000 pursuant to the software. The application 1060 and the O/S 1050 are read, in whole or in part, by the processor 1010, perhaps buffered within the processor 1010, and then executed.

When the application 1060 is implemented in software it should be noted that the application 1060 can be stored on virtually any computer readable storage medium for use by or in connection with any computer related system or method.

The application 1060 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 1060 is implemented in hardware, the application 1060 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a thermally assisted magnetoresistive random access memory device (TAS-MRAM), the method comprising:
   providing a storage layer having an anisotropic axis, wherein the storage layer is configured to store a state in off axis positions and on axis positions, and wherein the off axis positions are not aligned with the anisotropic axis;
   disposing a tunnel barrier disposed on top of the storage layer;
   disposing a ferromagnetic sense layer disposed on top of the tunnel barrier; and
   disposing a contact on top of the ferromagnetic sense layer;
   wherein the storage layer is configured to have a state read to obtain a first resistance value and a second resistance value;
   wherein the storage layer is configured to have the first resistance value and the second resistance value compared to predetermined resistance values, such that in response so the first resistance value and the second resistance value being different from the predetermined resistance values the storage layer is configured to have a magnetic orientation reset to a position for storing the state so that the first resistance value and the second resistance value are within a tolerance of the predetermined resistance values;
   wherein in response to the first resistance value and the second resistance value matching the predetermined resistance values within the tolerance, no further adjustments to the magnitude of the magnetic write field are made and the storage layer is configured to store the data state.

2. The method of claim 1, wherein the off axis positions define a magnetic orientation of the storage layer that is aligned off the anisotropic axis of the storage layer.

3. The method of claim 1, wherein a magnetic orientation of the storage layer is aligned off the anisotropic axis by a range of 1 to 179 degrees; and
   wherein the contact is a hard mask.

4. The method of claim 1, wherein off axis by 0 degrees and 180 degrees is defined as being on the anisotropic axis.

5. The method of claim 1, wherein a given off axis position storing the state has a magnetic orientation in the storage layer; and
   wherein the given off axis position is associated with a first resistance value and a second resistance value both of which are relative to the ferromagnetic sense layer.

6. The method of claim 1, wherein the storage layer is disposed on top of an antiferromagnetic pinning layer.

7. The method of claim 6, wherein the antiferromagnetic pinning layer comprises magnetic sublattices having a net magnetic moment of zero.

8. The method of claim 6, wherein the antiferromagnetic pinning layer is disposed on top of a seed layer.

9. The method of claim 8, wherein the seed layer is disposed on top of a multilayer spacer structure having multiple layers of metals structured to inhibit thermal conductivity and structured to electrically conduct electrical current.

10. The method of claim 9, wherein the multiple layers of metals include magnetic layers in a stack.

11. The method of claim 9, wherein the multiple layers of metals include at least one of metals and metal alloys.

12. The method of claim 9, wherein the multiple layers of metals include alternating layers metals and metal alloys.

13. The method of claim 6, wherein the antiferromagnetic pinning layer is disposed on top of a multilayer spacer structure having multiple layers of metals structured to inhibit thermal conductivity and structured to electrically conduct electrical current.

14. The method of claim 13, wherein the multiple layers of metals include magnetic layers in a stack.

15. The method of claim 13, wherein the multiple layers of metals include at least one of metals and metal alloys.

16. The method of claim 13, wherein the multiple layers of metals include alternating metals and metal alloys.

* * * * *